(12) United States Patent
Beyer et al.

(10) Patent No.: US 11,527,441 B2
(45) Date of Patent: Dec. 13, 2022

(54) METHOD FOR PRODUCING A DETACHMENT AREA IN A SOLID BODY

(71) Applicant: Siltectra GmbH, Dresden (DE)

(72) Inventors: Christian Beyer, Freiberg (DE); Jan Richter, Dresden (DE)

(73) Assignee: Siltectra GmbH, Dresden (DE)

(*) Notice: Subject to any disclaimer, the term of this patent is extended or adjusted under 35 U.S.C. 154(b) by 28 days.

(21) Appl. No.: 17/174,432

(22) Filed: Feb. 12, 2021

(65) Prior Publication Data

US 2021/0265215 A1 Aug. 26, 2021

Related U.S. Application Data

(63) Continuation of application No. 15/531,210, filed as application No. PCT/EP2015/077980 on Nov. 27, 2015, now Pat. No. 10,930,560.

(30) Foreign Application Priority Data

Nov. 27, 2014 (DE) .......................... 102014017582.0
Nov. 27, 2014 (DE) .......................... 102014017583.9
(Continued)

(51) Int. Cl.
*H01L 21/78* (2006.01)
*B23K 26/53* (2014.01)
(Continued)

(52) U.S. Cl.
CPC ...... *H01L 21/7813* (2013.01); *B23K 26/0006* (2013.01); *B23K 26/38* (2013.01);
(Continued)

(58) Field of Classification Search
CPC . H01L 21/7813; H01L 21/78; B23K 26/0006; B23K 26/38; B23K 26/53; B23K 2101/40; B23K 2103/56; H01S 5/0201
See application file for complete search history.

(56) References Cited

U.S. PATENT DOCUMENTS 5,968,382 A 10/1999 Matsumoto et al.
5,968,383 A 10/1999 Yamazaki et al.
(Continued)

FOREIGN PATENT DOCUMENTS

CN 102325717 A 1/2012
CN 103380482 A 10/2013
(Continued)

*Primary Examiner* — Kyoung Lee
*Assistant Examiner* — Christina A Sylvia
(74) *Attorney, Agent, or Firm* — Murphy, Bilak & Homiller, PLLC

(57) ABSTRACT

A method for producing a detachment area in a solid body in described. The solid body has a crystal lattice and is at least partially transparent to laser beams emitted by a laser. The method includes: modifying the crystal lattice of the solid by a laser beam, wherein the laser beam penetrates through a main surface of a detachable solid portion of the solid body, wherein a plurality of modifications are produced in the crystal lattice, wherein the modification are formed in a plane parallel to the main surface and at a distance from one another, wherein as a result of the modifications, the crystal lattice cracks the regions surrounding the modifications sub-critically in at least the one portion, and wherein the subcritical cracks are arranged in a plane parallel to the main surface.

11 Claims, 17 Drawing Sheets

(30) Foreign Application Priority Data

Dec. 17, 2014 (DE) .......................... 102014018841.8
Dec. 17, 2017 (DE) .......................... 102014018720.9

(51) Int. Cl.

| | | |
|---|---|---|
| *B23K 26/00* | (2014.01) | |
| *B23K 26/38* | (2014.01) | |
| *H01S 5/02* | (2006.01) | |
| *B23K 101/40* | (2006.01) | |
| *B23K 103/00* | (2006.01) | |

(52) U.S. Cl.
CPC .............. *B23K 26/53* (2015.10); *H01L 21/78* (2013.01); *H01S 5/0201* (2013.01); *B23K 2101/40* (2018.08); *B23K 2103/56* (2018.08)

(56) References Cited

U.S. PATENT DOCUMENTS

| | | | |
|---|---|---|---|
| 8,432,021 | B2 | 4/2013 | Moriwaka |
| 8,796,114 | B2 * | 8/2014 | Wagner ................... C30B 29/40 |
| | | | 438/464 |
| 9,902,016 | B2 | 2/2018 | Kawaguchi et al. |
| 2005/0048738 | A1 | 3/2005 | Shaheen et al. |
| 2010/0289189 | A1 | 11/2010 | Lichtensteiger et al. |
| 2011/0000897 | A1 | 1/2011 | Nakano et al. |
| 2012/0061356 | A1 | 3/2012 | Fukumitsu |
| 2012/0255935 | A1 | 10/2012 | Kakui et al. |
| 2013/0248500 | A1 | 9/2013 | Shreter et al. |
| 2013/0312460 | A1 * | 11/2013 | Kunishi .................. C30B 33/06 |
| | | | 65/112 |
| 2014/0197419 | A1 | 7/2014 | Henley et al. |
| 2016/0254232 | A1 | 9/2016 | Drescher et al. |

FOREIGN PATENT DOCUMENTS

| | | |
|---|---|---|
| CN | 103380842 A | 11/2013 |
| CN | 103459082 A | 12/2013 |
| DE | 102010030358 A1 | 12/2011 |
| DE | 102013007672 A1 | 11/2014 |
| EP | 2346066 A1 | 7/2011 |
| EP | 2665090 A1 | 11/2013 |
| EP | 2754524 A1 | 7/2014 |
| JP | H0929472 A | 2/1997 |
| JP | 2011155069 A | 8/2011 |
| JP | 2012169361 A | 9/2012 |
| JP | 2013046924 A | 3/2013 |
| JP | 2013049161 A | 3/2013 |
| JP | 2013158778 A | 8/2013 |
| JP | 2013161976 A | 8/2013 |
| JP | 2015074004 A | 4/2015 |
| KR | 20100070159 A | 6/2010 |
| WO | 2008033508 A2 | 3/2008 |
| WO | 2012074439 A2 | 6/2012 |
| WO | 2012108052 A1 | 8/2012 |
| WO | 2012108056 A1 | 8/2012 |
| WO | 2013009222 A1 | 1/2013 |
| WO | 2013115352 A1 | 8/2013 |
| WO | 2013126927 A2 | 8/2013 |
| WO | 2014156688 A1 | 10/2014 |
| WO | 2016083610 A2 | 6/2016 |

* cited by examiner

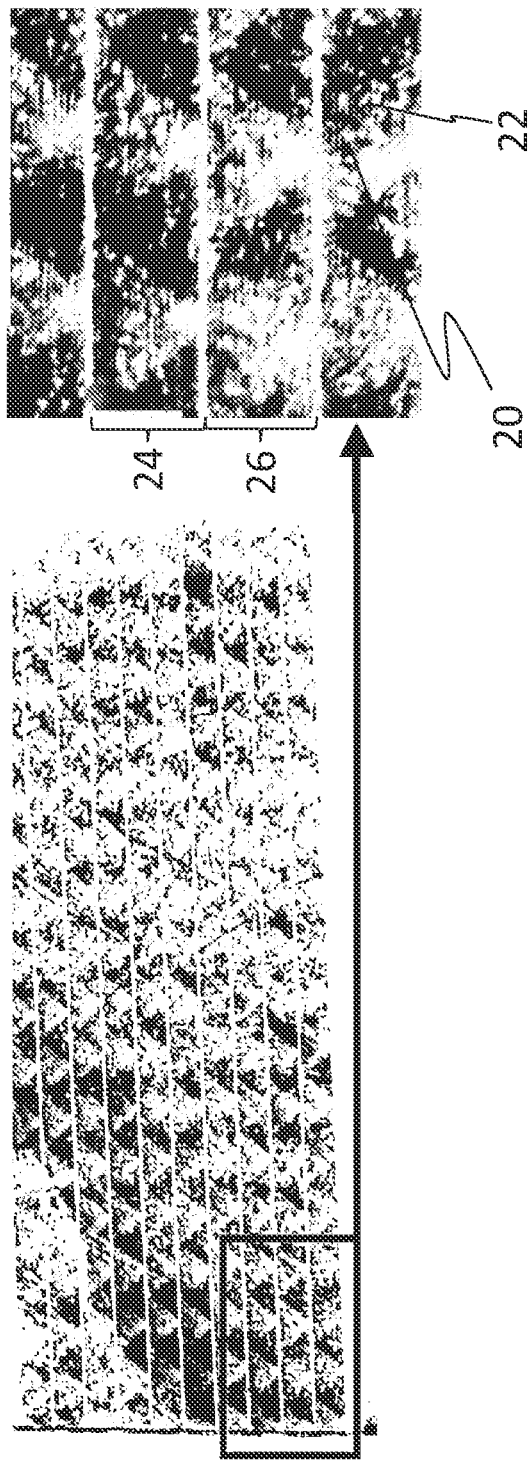
Fig. 2a
Fig. 2b
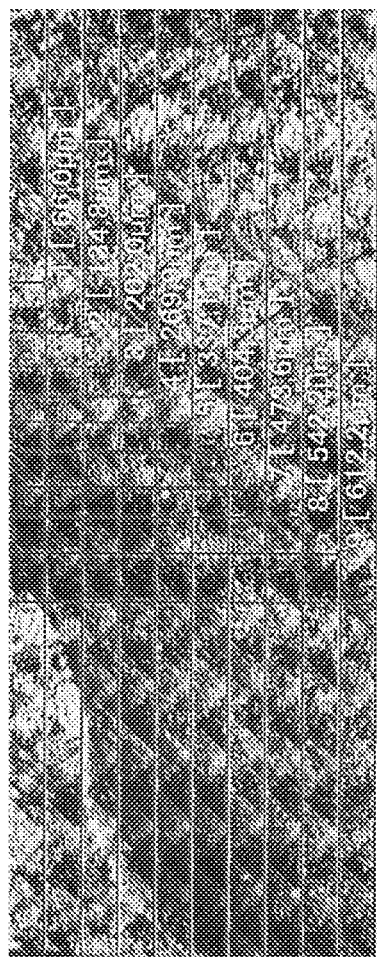
Fig. 2c

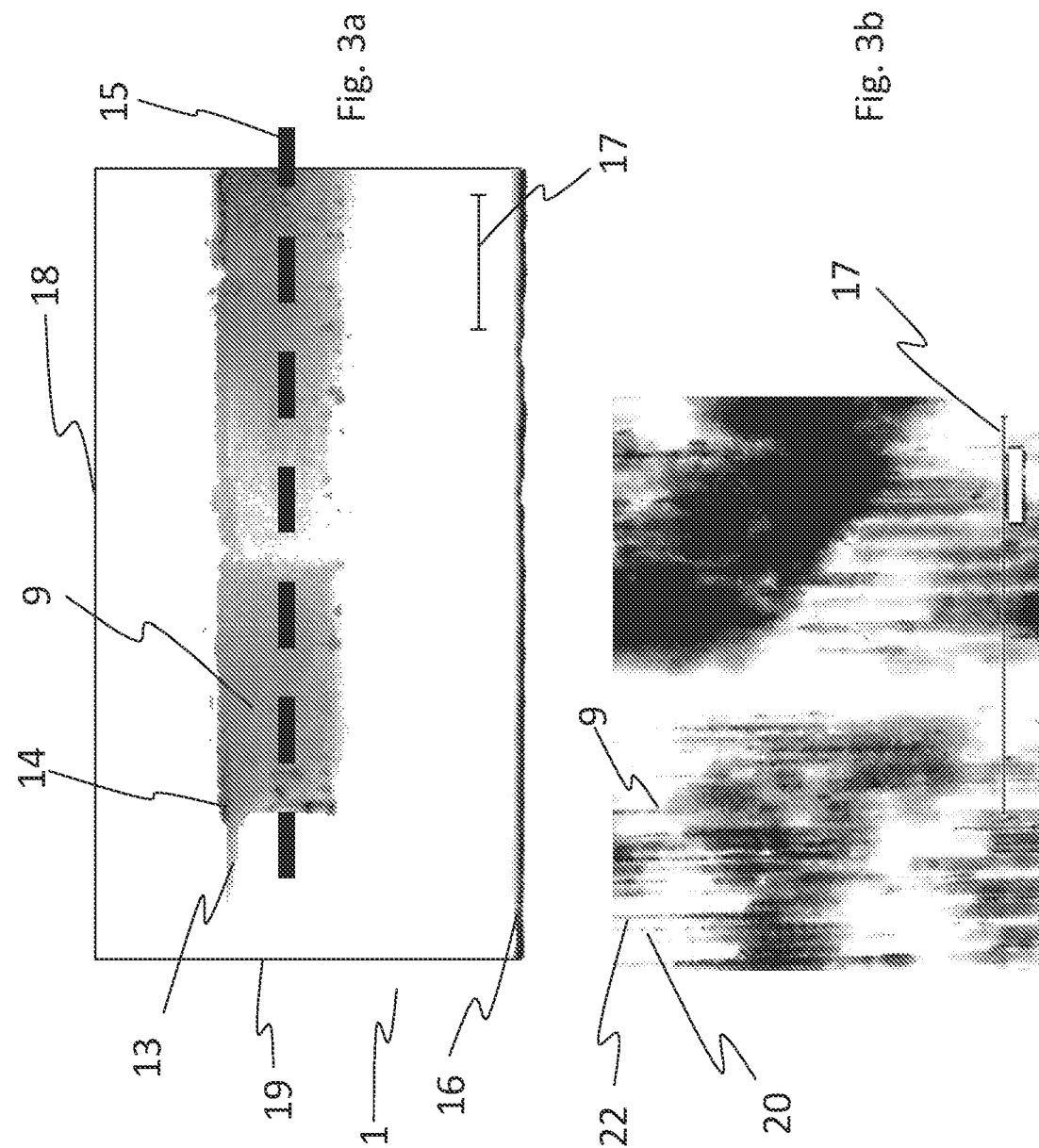

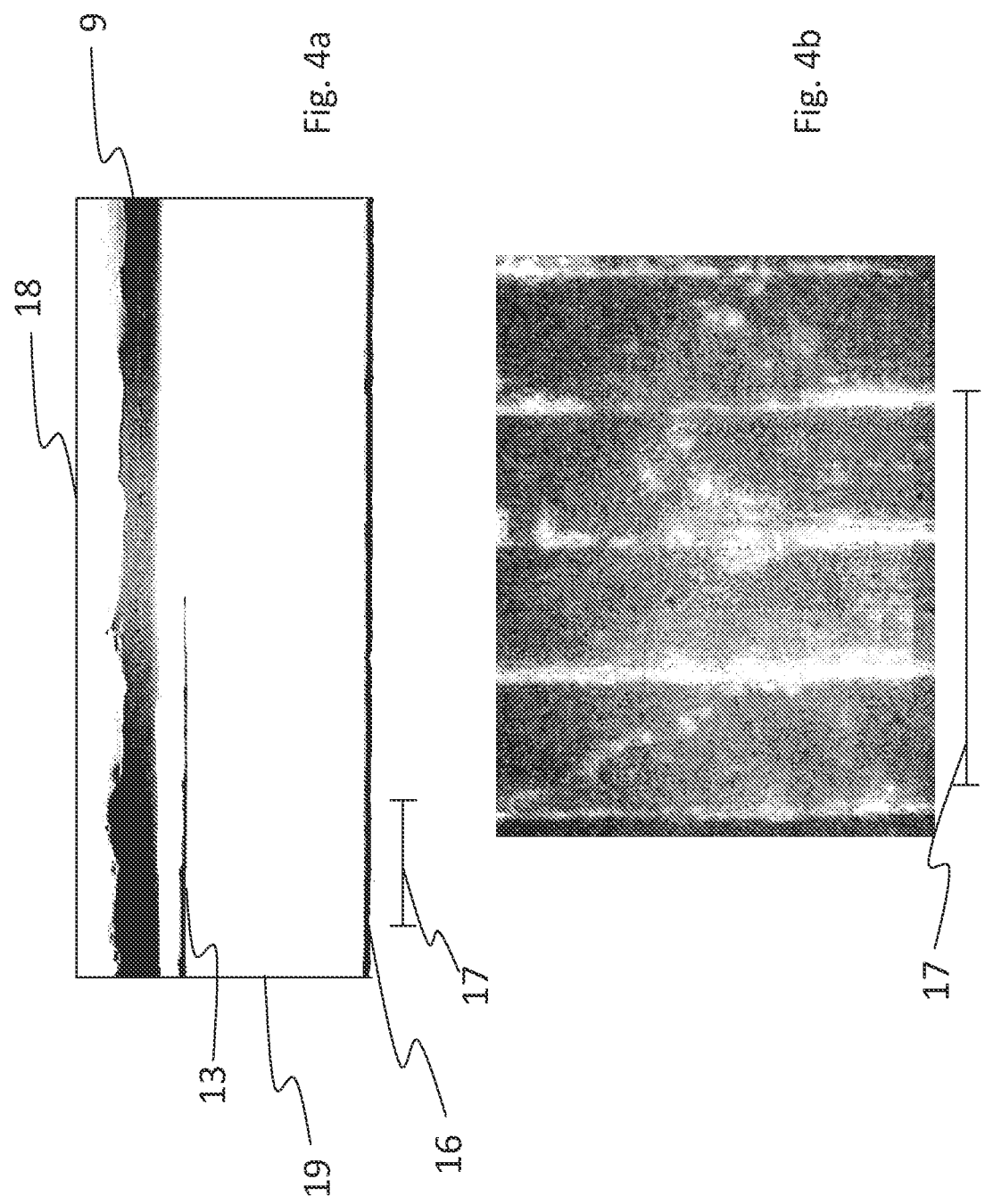

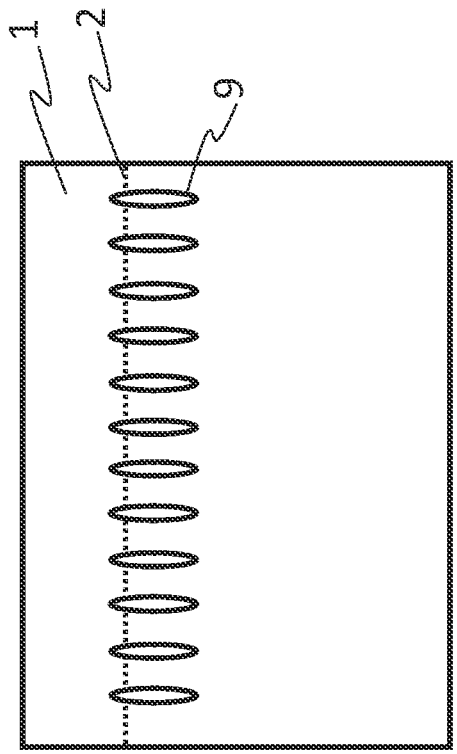
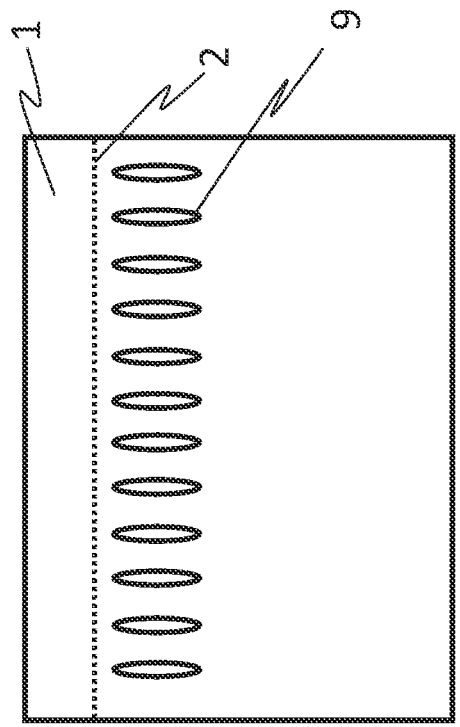
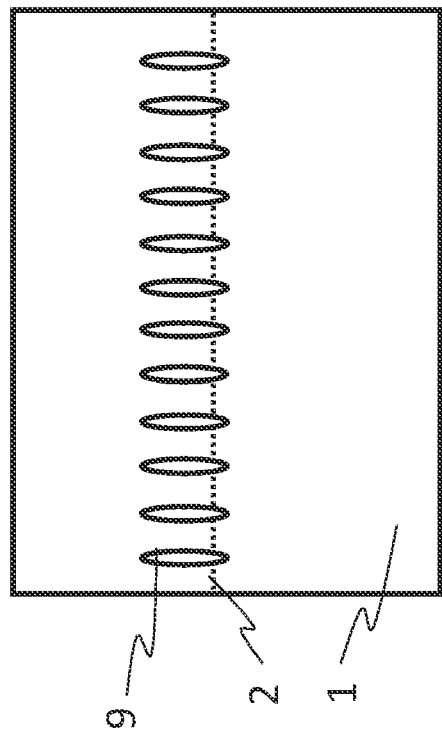
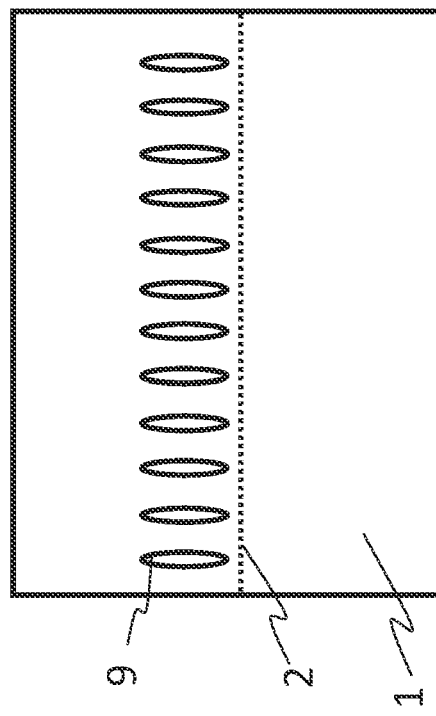

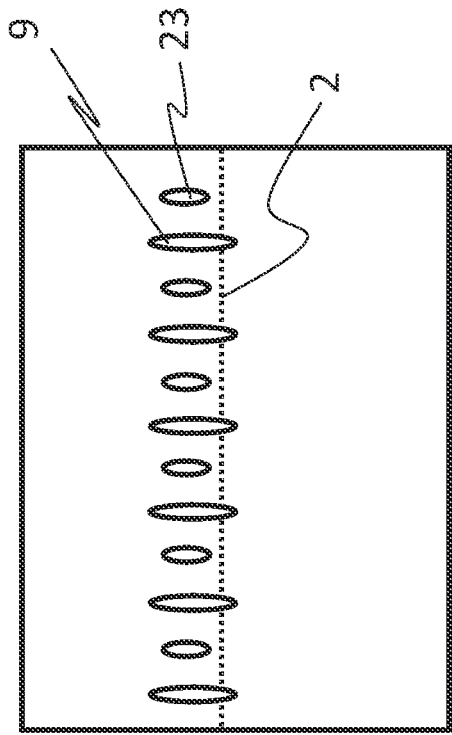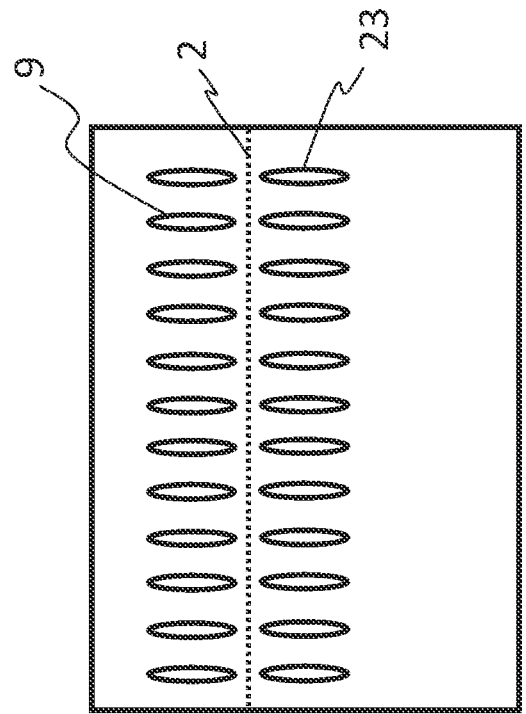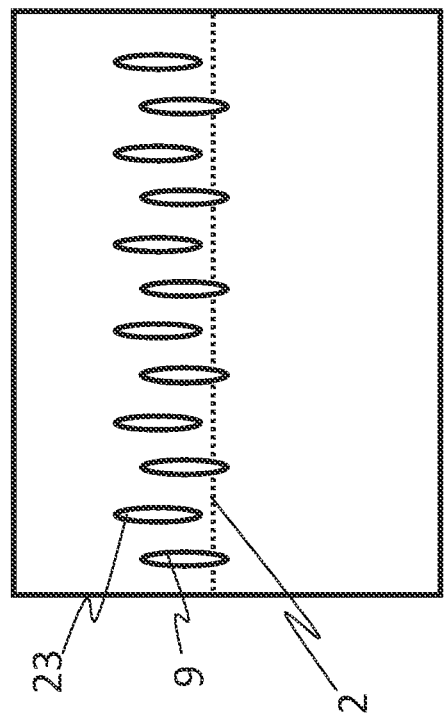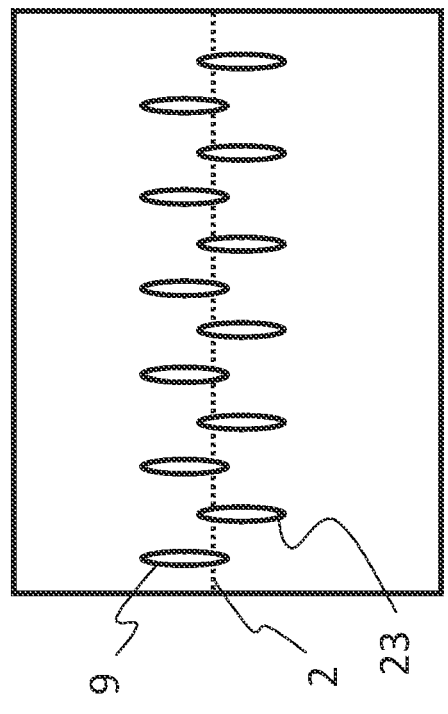

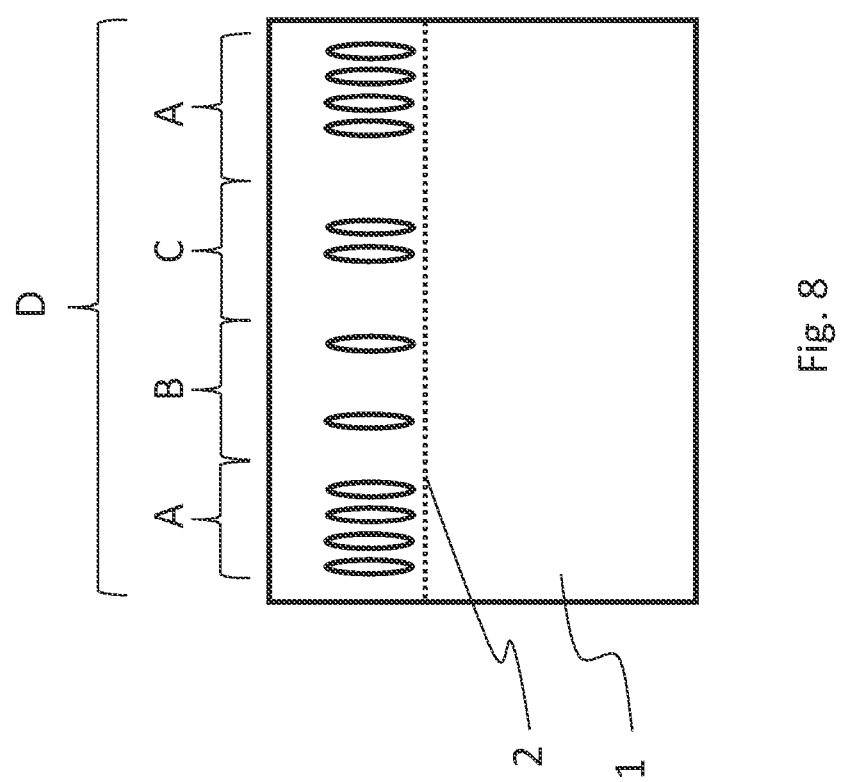

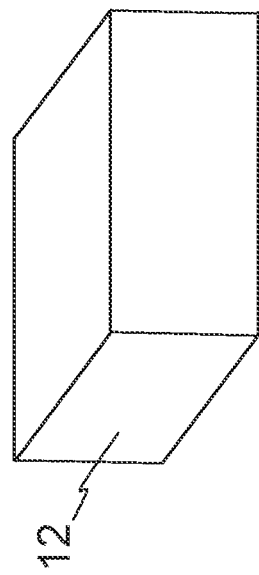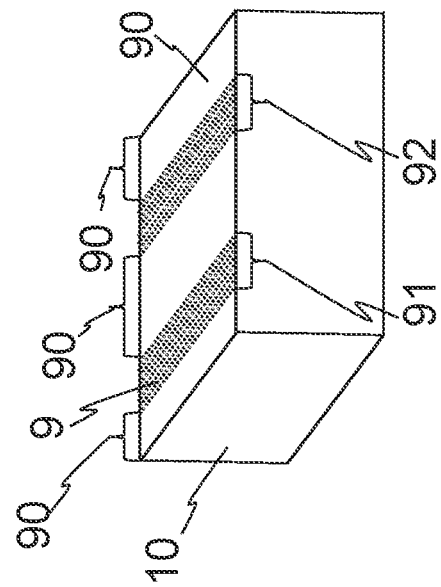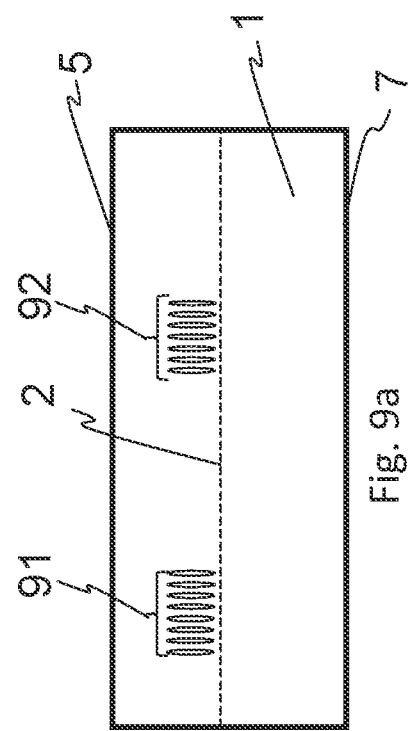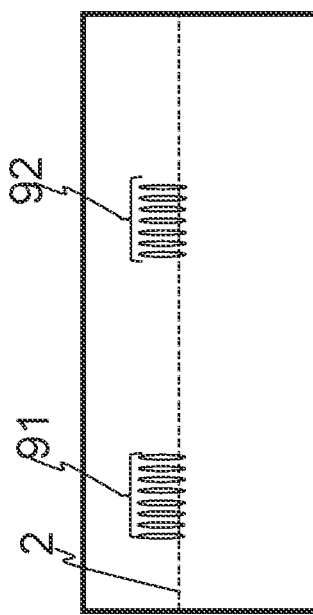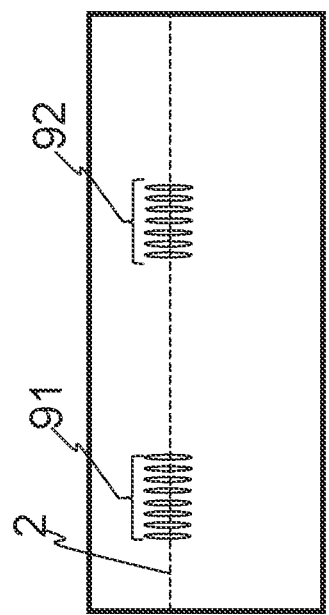

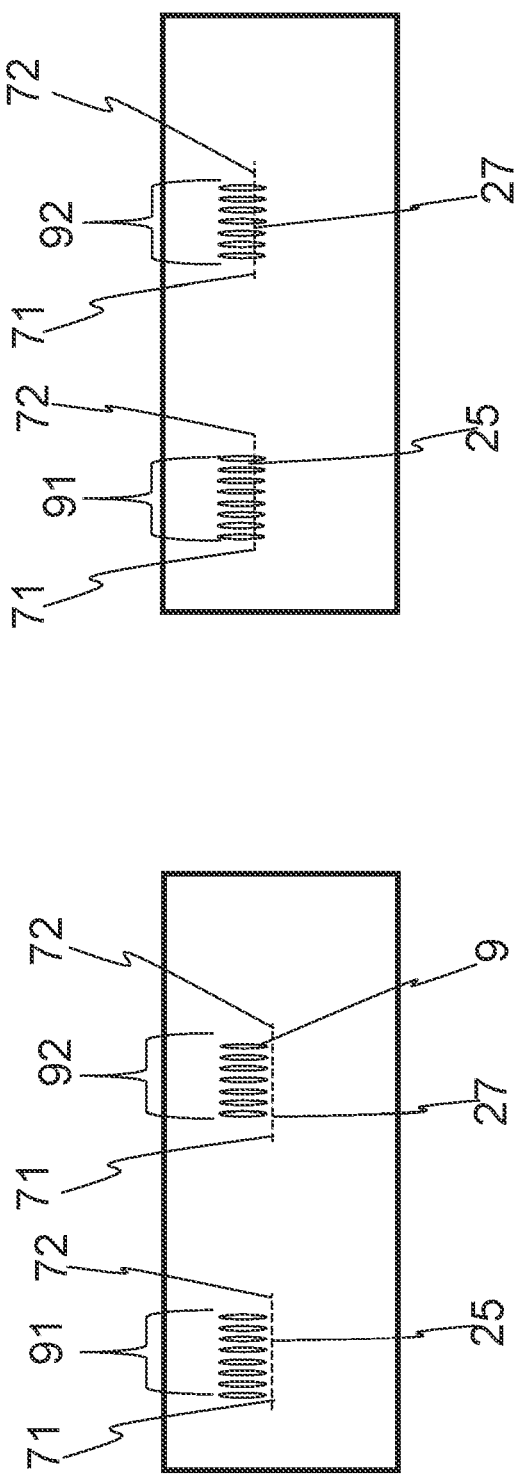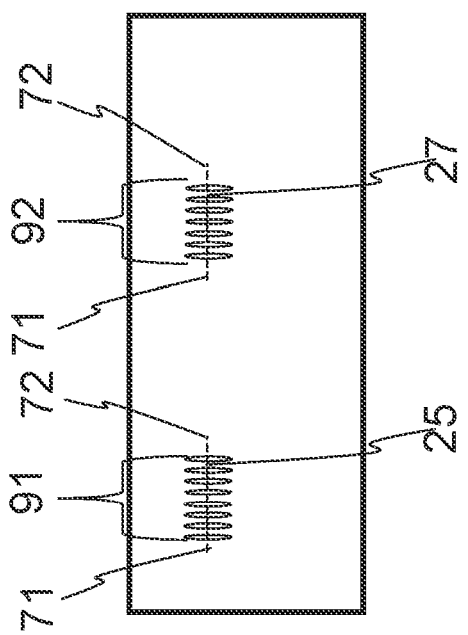

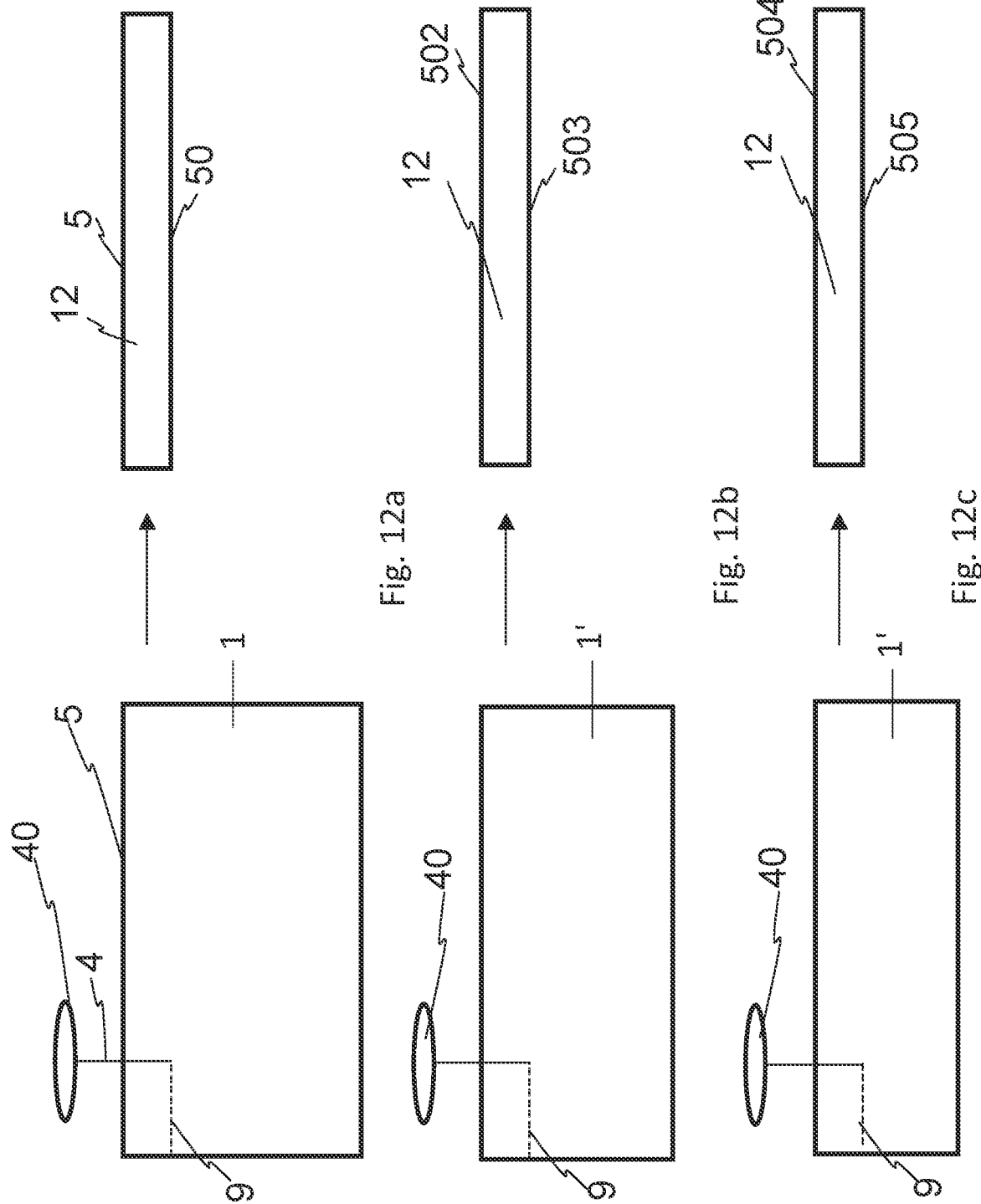

METHOD FOR PRODUCING A DETACHMENT AREA IN A SOLID BODY

The present invention relates to methods for creating a detachment area in a solid and to methods for at least partial splitting of a solid.

The splitting of solids, in particular wafers is classically accomplished by sawing. However, this separation method has many disadvantages. Thus, during sawing chips are always produced which thus form disturbed base material. Furthermore, the thickness fluctuation of the sawn discs also increases with increasing sawing height. Furthermore the sawing element has the effect that grooves are formed on the surfaces of the discs to be separated from one another.

It is therefore apparent that the "sawing" separation method incurs very high material costs and costs for re-working.

The document WO 2013/126927 A2 further discloses a method for separating device layers from an initial wafer. According to WO 2013/126927 A2, a very strong heating of the entire arrangement takes place as a result of laser action. This heating is required in order to achieve stresses inside the solid over the various coefficients of thermal expansion of the solid material and a "handler". Here it is apparent that the thermal load-bearing capacity of the "handler" must be very high since very high temperatures occur. Furthermore, according to WO 2013/126927 A2 the laser beams are always introduced into the solid via a surface which is not part of the layer to be separated. This also results is strong heating of the solid. The high temperatures also have the disadvantage that the solid distorts and undesirably expands with the result that crystal lattice modifications can only be produced very imprecisely.

According to WO 2013/126927 A2, therefore thick and large solids cannot be processed.

It is therefore the object of the present invention to provide an alternative method for separating solid parts, in particular of several solid layers, from a solid. The aforesaid object is solved according to the invention by a method for producing a detachment region in a solid, in particular for splitting the solid along the detachment region, wherein the solid portion to be detached is thinner than the solid reduced by the solid portion. According to the invention, the method preferably comprises at least the step of modifying the crystal lattice of the solid by means of a modifying agent, in particular a laser, in particular a pico- or femtosecond laser, wherein the modifications, in particular the laser beams penetrate into the solid via a surface of the solid portion to be detached, wherein a plurality of modifications are produced in the crystal lattice, wherein as a result of the modifications, the crystal lattice cracks the regions surrounding the modifications, at least in respectively one portion, in particular sub-critically.

This solution is advantageous since it allows a defined weakening of the solid without causing chippings, for example.

Furthermore, the present invention provides the possibility for the first time that a solid need not be shortened orthogonally to its longitudinal direction to be shortened but that it is acted upon by the laser in its longitudinal direction in such a manner that a solid layer is separated. This method further has the advantage that the laser beams need not penetrate into the solid over the entire radius of the solid but can be introduced into the solid via a layer preferably parallel to the separation layer or detachment layer. This is particularly appropriate in solids whose radius is greater than or equal to the thickness of the solid layer to be separated.

According to a further preferred embodiment of the present invention, the crystal lattice tears at least for the most part in each case in a portion spaced apart from the centre of the respective modification. This solution is particularly advantageous since it reduces the need for reworking of the part of the solid on which a smaller volume of the modification or of the modifications remains after the separation.

The aforesaid object is also solved according to the invention by a further method for producing a detachment region in a solid, in particular for splitting the solid along the detachment region, preferably comprises at least the steps of modifying the crystal lattice of the solid by means of a modifying agent, in particular a laser, in particular a pico- or femtosecond laser or an ion implanting medium, by means of which ions for modification of the crystal lattice are introduced into the crystal lattice, wherein a plurality of modifications are produced in the crystal lattice, and the conditioning of at least a plurality of the modifications by a conditioning agent, in particular a temperature-control device, wherein the crystal lattice cracks in the regions surrounding the modification at least in respectively one portion due to the conditioning.

The aforesaid object is also solved according to the invention by a further method for at least partial splitting of a solid, wherein so many modifications are produced in the crystal lattice that the individual cracks combine to form a main crack through which the solid is at least partially and preferably completely split.

This solution is advantageous since it allows a defined splitting of the solid without causing chippings, for example.

The aforesaid object is also solved according to the invention by a further method for at least partial splitting of a solid, wherein the modifications are produced in a first section of the solid, whereby a main crack extending through the individual, in particular sub-critical cracks is formed, wherein after the formation of the main crack or as a result of the formation of the main crack further modifications are produced in at least one further section of the solid, wherein the main crack is guided through cracks in the area of the further modifications also into the at least one further section, in particular until the initially locally detached solid portions are completely separated by the main crack.

This solution is advantageous since it allows a defined splitting of the solid without causing chippings, for example.

Sub-critical preferably means here that the crack propagation comes to a halt or stops before the crack splits the solid into at least two parts. Preferably a sub-critical crack propagates less than 5 mm, in particular less than 1 mm, in the solid. The modifications are preferably produced in such a manner that for example, when separating flat solid plates, the sub-critical cracks preferably propagate for the most part in the same plane, in particular propagate in a plane parallel or aligned in a defined manner to the surface of the solid through which the laser beams penetrate into the solid. The modifications are preferably produced in such a manner that, for example, during separation of uneven solids, the sub-critical cracks preferably propagate in a defined manner e.g. in a spherical layer or film in such a manner that the detachment region acquires a defined, in particular spherical shape.

The solid is preferably an ingot or a wafer. Particularly preferably the solid is a material which is at least partially transparent to laser beams. It is therefore still feasible that the solid comprises a transparent material or consists or is made partially from a transparent material such as, for example sapphire. Further materials which are considered here as solid material alone or combined with another material are, for example, "wide band gap" materials, InAlSb, high-temperature superconductors, in particular rare earth cuprates (e.g. $YBa_2Cu_3O_7$). It is additionally or alternatively feasible that the solid is a photomask wherein preferably any photomask material known at the filing date and particularly preferably combinations thereof can be used as photomask material in the present case. Furthermore, the solid can additionally or alternatively comprise or consist of silicon carbide (SiC).

According to a further preferred embodiment of the present invention, the energy of the laser beam of the laser, in particular fs laser (femtosecond laser) is selected in such a manner that the damage propagation in the solid or in the crystal is less than three times the Rayleigh length, preferably less than the Rayleigh length and particularly preferably less than a third of the Rayleigh length.

According to a further preferred embodiment of the present invention, the crystal lattice cracks at least for the most part in a portion spaced apart from the centre Z of the respective modification.

According to a further preferred embodiment of the present invention, the crack passes at least in sections through the majority, in particular through the entirety of the modifications or runs at a distance at least to the entirety of the modifications.

According to a further preferred embodiment of the present invention, a first number of modifications are produced with their centre Z on one side of the detachment region and a second number of modifications are produced with their centre on the other side of the detachment region.

According to a further preferred embodiment of the present invention, the modifications are produced by means of lasers, wherein the pulse spacings between 0.01 μm and 10 μm are provided and/or linear spacings between 0.01 μm and 20 μm and/or a pulse repetition frequency between 16 kHz and 1024 kHz is provided.

According to a further preferred embodiment of the present invention, the wavelength of the laser beam of the laser, in particular of the fs laser, is selected in such a manner that the absorption of the solid or the material is less than 10 $cm^{-1}$, and preferably less than 1 $cm^{-1}$ and particularly preferably less than 0.1 $cm^{-1}$.

According to a further preferred embodiment of the present invention, the individual modifications or defects or damage points result from a multi-photon excitation caused by the laser, in particular the fs laser.

According to a further preferred embodiment of the present invention, the solid is connected to a cooling device by means of a solid surface, wherein the solid surface which is connected to the cooling device is configured to be parallel or substantially parallel to the surface via which the laser beams penetrate into the solid, wherein the cooling device is operated depending on the laser application, in particular depending on the temperature control of the solid resulting from the laser application. Particularly preferably the surface via which the solid is connected to the cooling device is precisely opposite the surface via which the laser beams penetrate into the solid. This embodiment is advantageous since an increase in the temperature of the solid which takes place during production of the modifications can be limited or reduced. Preferably the cooling device is operated in such a manner that the heat input introduced by the laser beams into the solid is removed from the solid by the cooling device. This is advantageous since the occurrence of thermally induced stresses or deformations can be significantly reduced thereby.

According to a further preferred embodiment of the present invention, the cooling device has at least one sensor device for detecting the temperature of the solid and brings about the cooling of the solid depending on a predetermined temperature profile. This embodiment is advantageous since a temperature variation of the solid can be detected very precisely by the sensor device. Preferably the temperature variation is used as data input to control the cooling device.

According to a further preferred embodiment of the present invention, the cooling device is coupled to a rotating device and the cooling device with the solid arranged thereon is rotated during the production of the modifications by means of the rotating device, in particular is rotated at a speed of more than 100 revolutions per minute or more than 200 revolutions per minute or more than 500 revolutions per minute.

According to a further preferred embodiment of the present invention, in at least two different regions of the solid the number of modifications produced per $cm^2$ is different, wherein in a first region a first block of modification lines is produced, wherein the individual modifications per line are produced preferably spaced apart from one another by less than 10 μm, in particular less than 5 μm or less than 3 μm or less than 1 μm or less than 0.5 μm and the individual lines of the first block are produced spaced apart from one another by less than 20 μm, in particular less than 15 μm or less than 10 μm or less than 5 μm or less than 1 μm, wherein a first partial detachment region is formed by the first block of modifications and wherein in a second region a second block of modification lines is produced, wherein the individual modifications per line are produced preferably spaced apart from one another by less than 10 μm, in particular less than 5 μm or less than 3 μm or less than 1 μm or less than 0.5 μm and the individual lines of the second block are produced spaced apart from one another by less than 20 μm, in particular less than 15 μm or less than 10 μm or less than 5 μm or less than 1 μm, wherein a second partial detachment region is formed by the second block of modifications, wherein the first region and the second region are spaced apart from one another by a third region, wherein in the third region none or substantially no modifications or fewer modifications per $cm^2$ compared with the first or second region are produced by means of laser beams and the first region is spaced apart from the second region by more than 20 μm, in particular more than 50 μm or more than 100 μm or more than 150 μm or more than 200 μm. This embodiment is advantageous since as a result of the local generation of modification blocks, large mechanical stresses can be produced in the solid in such a manner that a local tearing of the solid can take place. It was identified that the modification blocks have the effect that a crack is also guided stably in a region between two modification blocks. Thanks to the modification blocks, a controlled and very precise crack propagation can be brought about with few modifications. This has considerable advantages since the processing work is shortened, the energy consumption is reduced and the heating of the solid is reduced.

Preferably the modifications in the first block are produced in pulse spacings between 0.01 μm and 10 μm and/or linear spacings between 0.01 μm and 20 μm are provided and/or a pulse repetition frequency between 16 kHz and 20 MHz is provided.

Further advantages, aims and properties of the present invention are explained with reference to the following description of appended drawings in which the separation method according to the invention is shown as an example. Components or elements which are preferably used in the method according to the invention and/or which agree at least substantially with regard to their function in the figures can be characterized with the same reference numbers, wherein these components or elements need not be numbered or explained in all the figures.

In the figures:

FIG. 2a-2c shows microscope photographs of crystal lattice modifications;

FIG. 3a-3b shows further microscope photographs of crystal lattice modifications;

FIG. 4a-4b shows yet further microscope photographs of crystal lattice modifications;

FIG. 6a-6d shows a further schematic view of modifications and the detachment region;

FIG. 7a-7d shows yet further schematic views of modifications and the detachment region;

FIG. 8 shows a schematic view of different modification concentrations;

FIG. 9a-9c shows three schematic cross-sectional views which each show modification blocks in a solid;

FIG. 9d-9e show two schematic views in each case along the detachment regions of split solids where the view according to FIG. 9d shows no modification residue and the view according to FIG. 9e shows modification residue;

Figure 11A:
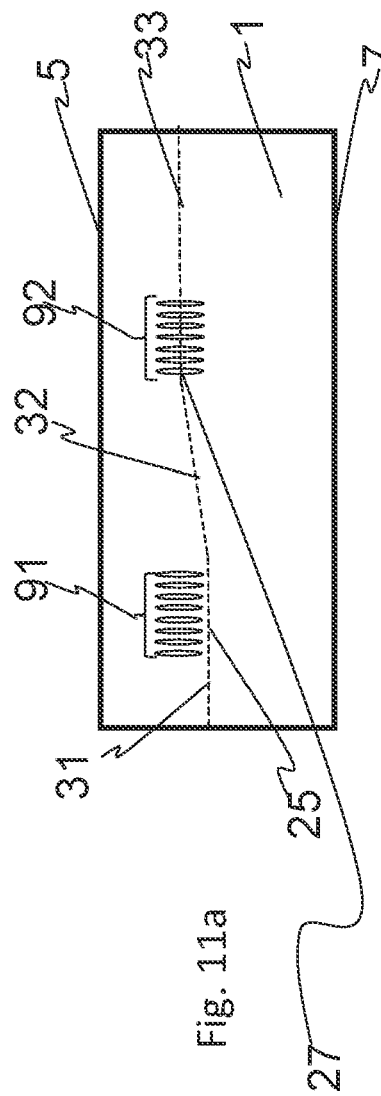
Figure 11B:
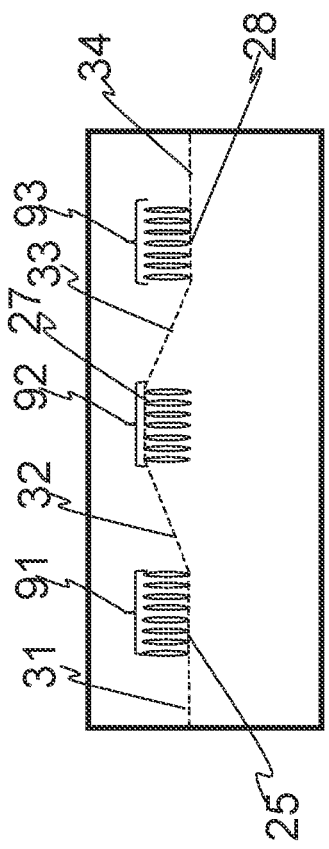
Figure 11C:
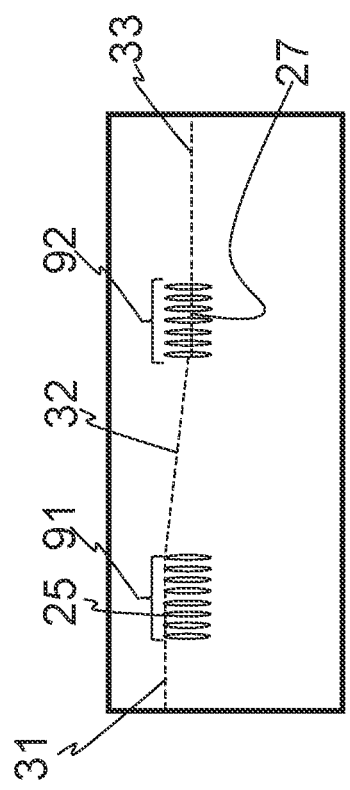
Figure 14C:
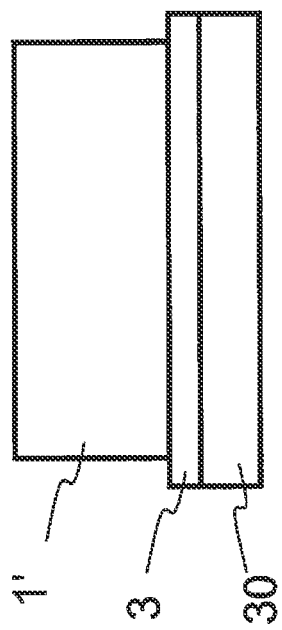
Figure 14D:
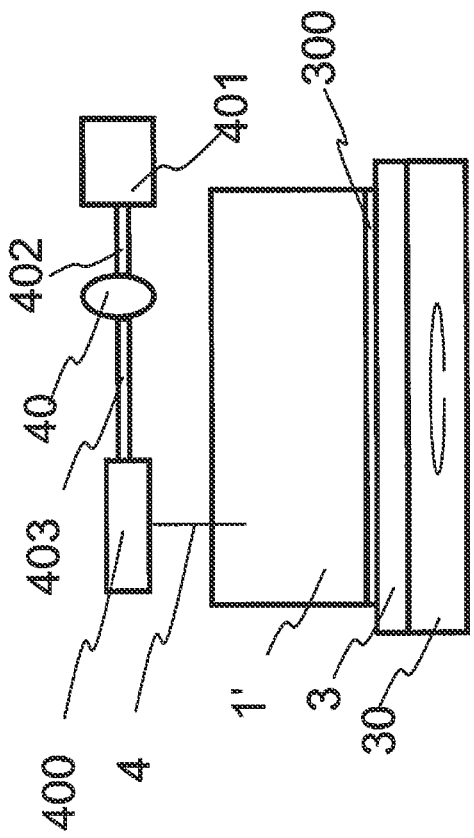
Figure 14A:
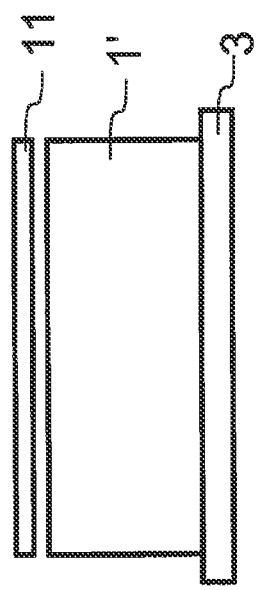
Figure 14B:
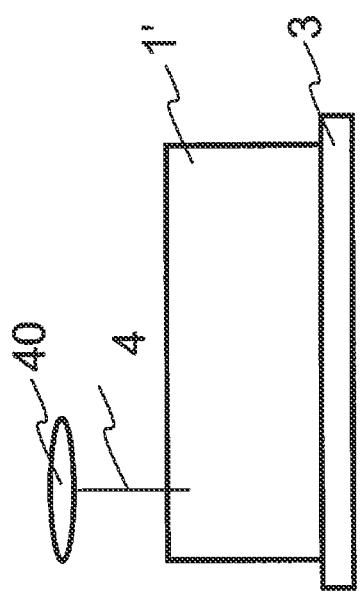
Figure 15:
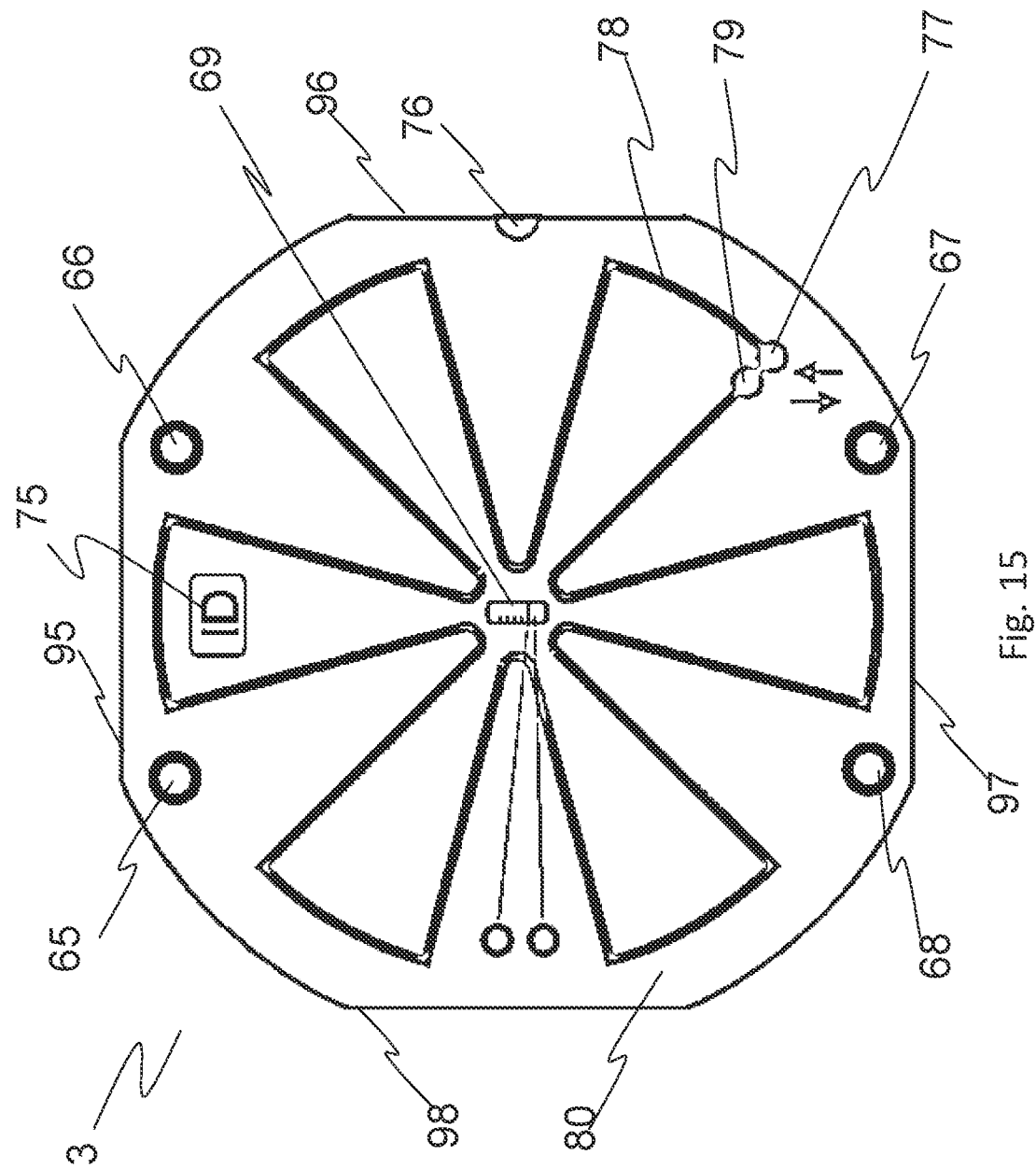
Figure 16:
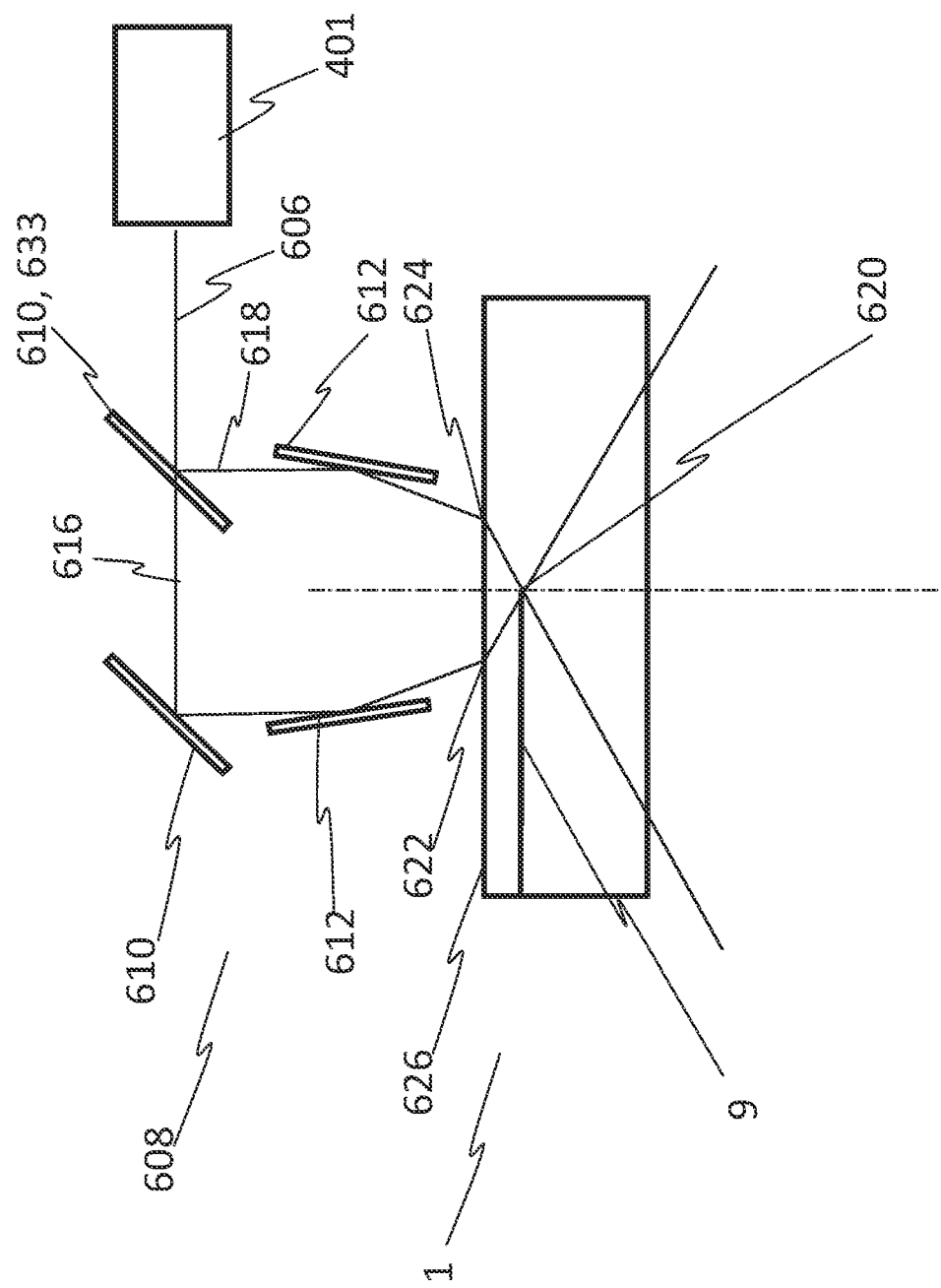

FIG. 10a-c shows three schematic views of modification blocks and the local solid weakenings or local solid initial cracks produced as a result;

FIG. 11a-c shows three schematic views of exemplary crack profiles;

FIG. 12a-c shows the multiple separation of solid portions or solid layers, in particular wafers, from a solid;

FIG. 13a-d shows several steps from the preparation of the solid to the crack triggering;

FIG. 14a shows a schematic view of the state after separation of the solid portion;

FIG. 14b shows another laser application to the residual solid to produce modifications for separating a further solid layer;

FIG. 14c shows a schematic view of the residual solid arranged on a cooling device, wherein the cooling device is arranged on a traversing device, in particular a rotary table;

FIG. 14d shows a schematic view to produce modifications in the solid;

FIG. 15 shows a schematic view of a cooling device, in particular a cooling chuck;

FIG. 16 shows a schematic view of a preferably used optics; and

Figure 17:
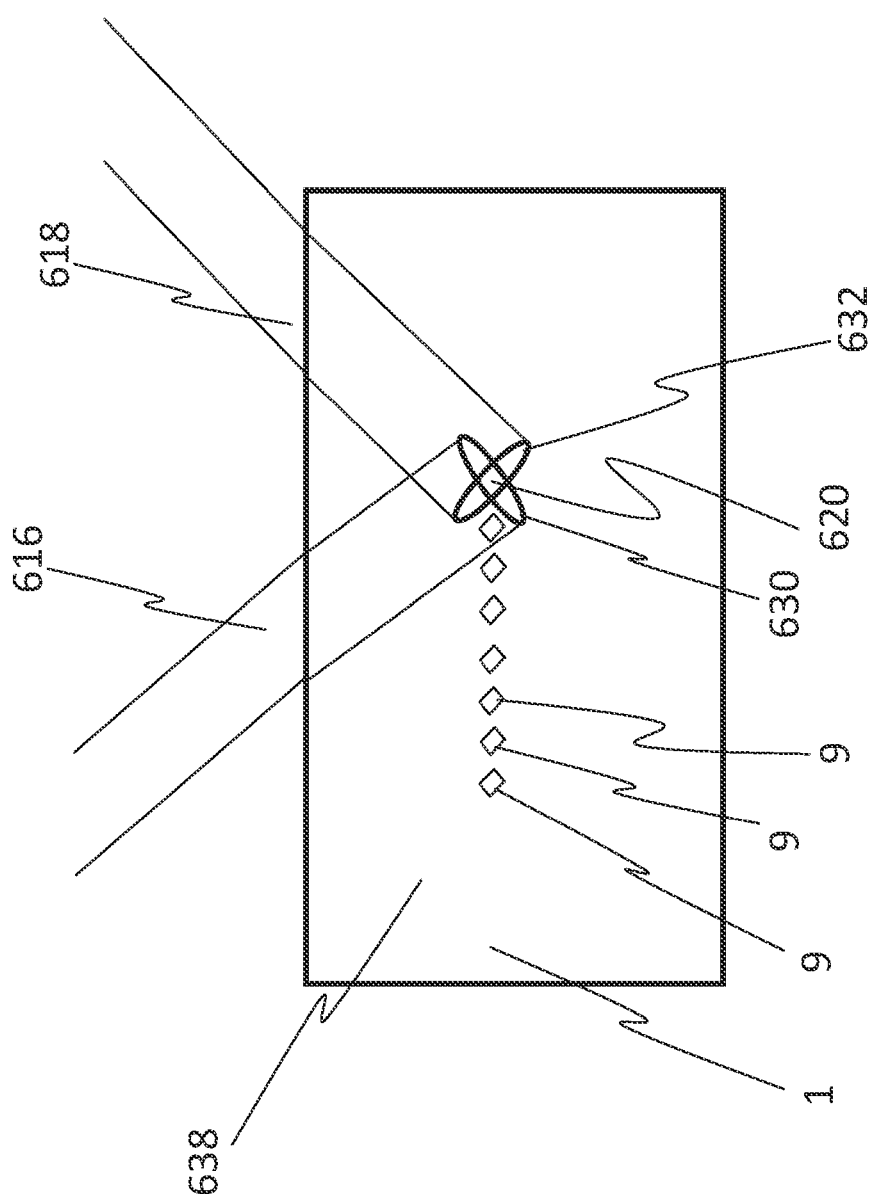

FIG. 17 shows a schematic view of superposed beams or beam fractions when producing a modification in the solid.

The reference number 1 here characterizes the solid. Modifications 9 according to the invention are produced in the solid 1 in order to form a detachment region 2 at which or along which the solid 1 is separated into at least two components. The modifications 9 bring about sub-critical cracks through which the detachment region 2 is created. The modifications 9 are produced by at least one laser beam 4. The laser beam 4 penetrates via a preferably treated, in particular polished surface 5 into the preferably at least partially transparent solid 1. At the surface 5 the at least one laser beam is preferably refracted, which is characterized by the reference number 6. The at least one laser beam then forms a focus 8 to produce the modification. The polished surface 5 can also be designated as main surface 18 (cf. FIG. 3a).

The reference number 10 characterizes a first solid portion after cutting through the solid 1 and the reference number characterizes the second solid portion after cutting through the solid 1. The reference number 11 further characterizes the surfaces along which the two solid portions 10, 12 were separated from one another. It is apparent that the modifications 9 are provided substantially, for the most part or completely in the solid portion 10 and after the separation the solid portion 12 preferably has none or only very few modifications, in particular less than 30 percent of the modifications produced. However, it is also feasible that the modifications for the most part remain in the second solid portion 12.

FIGS. 2a to 2c show different microscopic views of a solid 1 conditioned or modified by means of a laser, in particular consisting predominantly, substantially or completely of, for example a semiconductor material, in particular of SiC.

FIG. 2a shows a 6H—SiC line defect field 1E which was produced with pulse spacings of 0.4 µm, linear spacings of linearly produced crystal lattice modifications 20, 33 of 2 µm and a pulse repetition frequency of 128 kHz. Here however it is also feasible that one of the parameters, several of the parameters, in particular two of these parameters or all of these parameters (pulse spacings, linear spacings pulse repetition frequency) are specified as varied or changed. For example, the pulse spacings can be provided, for example, between 0.01 µm and 10 µm and/or the linear spacings can be provided between 0.01 µm and 20 µm and/or the pulse repetition frequency can be provided between 16 kHz and 1024 kHz.

FIG. 2b shows an enlarged detailed view of the area identified by the frame in FIG. 2a. It can be seen that the block spacings 24, 26 are preferably configured to be uniform and, for example, are 66 µm. FIG. 2c also shows block spacings which are around 66 µm. However it is also feasible that the block spacings lie in different ranges such as, for example, in the range between 4 µm and 1000 µm.

The diagram in FIG. 2a shows a plan view of a solid through a polished surface of the solid. The structure shown is therefore formed inside the solid or has been produced by modification, in particular by means of laser.

Crack formation is preferably not initiated in the configuration shown.

FIGS. 3a and 3b show microscopic views of solids modified in the sense of the invention. In FIG. 3a the reference number 14 preferably identifies the location of the start of processing, i.e. the location at which the modification of the crystal lattice of the solid 1 is preferably begun. The reference number 9 identifies the modified area in the solid 1. It can be seen from this diagram that a crack 13 propagates in the solid 1 eccentrically to the modified area 9 or offset to the centre 15 of the modified area 9. It is hereby possible that the location and direction of the propagation of the crack 13 are predefined by defined parameters to produce the modification, wherein the crack 13 in the example shown runs preferably parallel or substantially parallel to the main surface 18. The crack 13 can thus be produced or initiated and guided through the parameter setting/s specifically through the modifications 9, at the edges of the modifications 9 or at a distance from the modifications 9.

The underside of the solid 1, in particular the wafer is given by the reference number 16. Furthermore the reference number 17 indicates a reference length which preferably measures 50 μm. The cross-sectional area shown extends at right angles to the main surface 18 of the solid 1, i.,e. over the height of the lateral surface 19, wherein the modifications 9 are preferably introduced into the solid 1 via the main surface 18 or the modifications 9 are preferably produced through the main surface 18. The main surface 18 is particularly preferably a multiple, in particular at least twice or at least three times or at least four times or at least ten times or at least 20 times or at least 50 times larger than the lateral surface 19.

FIG. 3a shows a 6H—SiC line defect field 1C which was produced with pulse spacings of 0.2 μm, linear spacings of linearly produced crystal lattice modifications 20, 33 of 3 μm and a pulse repetition frequency of 128 kHz. Here however it is also feasible that one of the parameters, several of the parameters, in particular two of these parameters or all of these parameters (pulse spacings, linear spacings, pulse repetition frequency) are specified as varied or changed. For example, the pulse spacings can be provided, for example, between 0.01 μm and 10 μm and/or the linear spacings can be provided between 0.01 μm and 20 μm and/or the pulse repetition frequency can be provided between 16 kHz and 1024 kHz.

FIG. 3b shows a plan view of a part of the solid 1 and through the polished main surface 18 of the modifications 9. The individual modifications 9 are produced according to this diagram in such a manner that several of them form a line 20, 22. However it is also feasible here that the modifications are produced homogeneously at least partially in more than one direction, in particular in two directions, in at least two directions or in three directions. The modifications 9 are particularly preferably produced preferably uniformly or homogeneous distributed in a plane parallel to the main surface 18. However, it is also feasible that in one direction (length or width or height) more modifications 9 are produced than in one or two other directions. Furthermore it is feasible that the modifications 9 are produced in such a manner that they form patterns. Furthermore the modifications 9 can be produced in the sense of the present invention in various regions of the solid 1, wherein the regions preferably have the same dimensions, in different numbers and/or with different parameters.

The reference number 17 in FIG. 3b characterizes a reference length which preferably measures 100 μm.

FIG. 4a shows a 6H—SiC line defect field 1A which was produced with pulse spacings of 0.2 μm, linear spacings of linearly produced crystal lattice modifications 20, 22 of 1 μm and a pulse repetition frequency of 128 kHz. Here however it is also feasible that one of the parameters, several of the parameters, in particular two of these parameters or all of these parameters (pulse spacings, linear spacings, pulse repetition frequency) are specified as varied or changed. For example, the pulse spacings can be provided, for example, between 0.01 μm and 10 μm and/or the linear spacings can be provided between 0.01 μm and 20 μm and/or the pulse repetition frequency can be provided between 16 kHz and 1024 kHz.

It can be further deduced from FIG. 4a that a crack 13 propagates in the solid 1 at a distance from the generated modifications 9. The crack 13 therefore propagates at a distance from the centre of the modifications 9 or the crack propagates in an area of the solid 1 which is at a distance from the main modification portion. The main modification portion is, for example, in the case of modifications 9 produced by laser, preferably the portion of the solid 1 in which the laser has its focus.

The reference number 17 characterizes the reference length which is preferably 100 μm.

Figure 1:
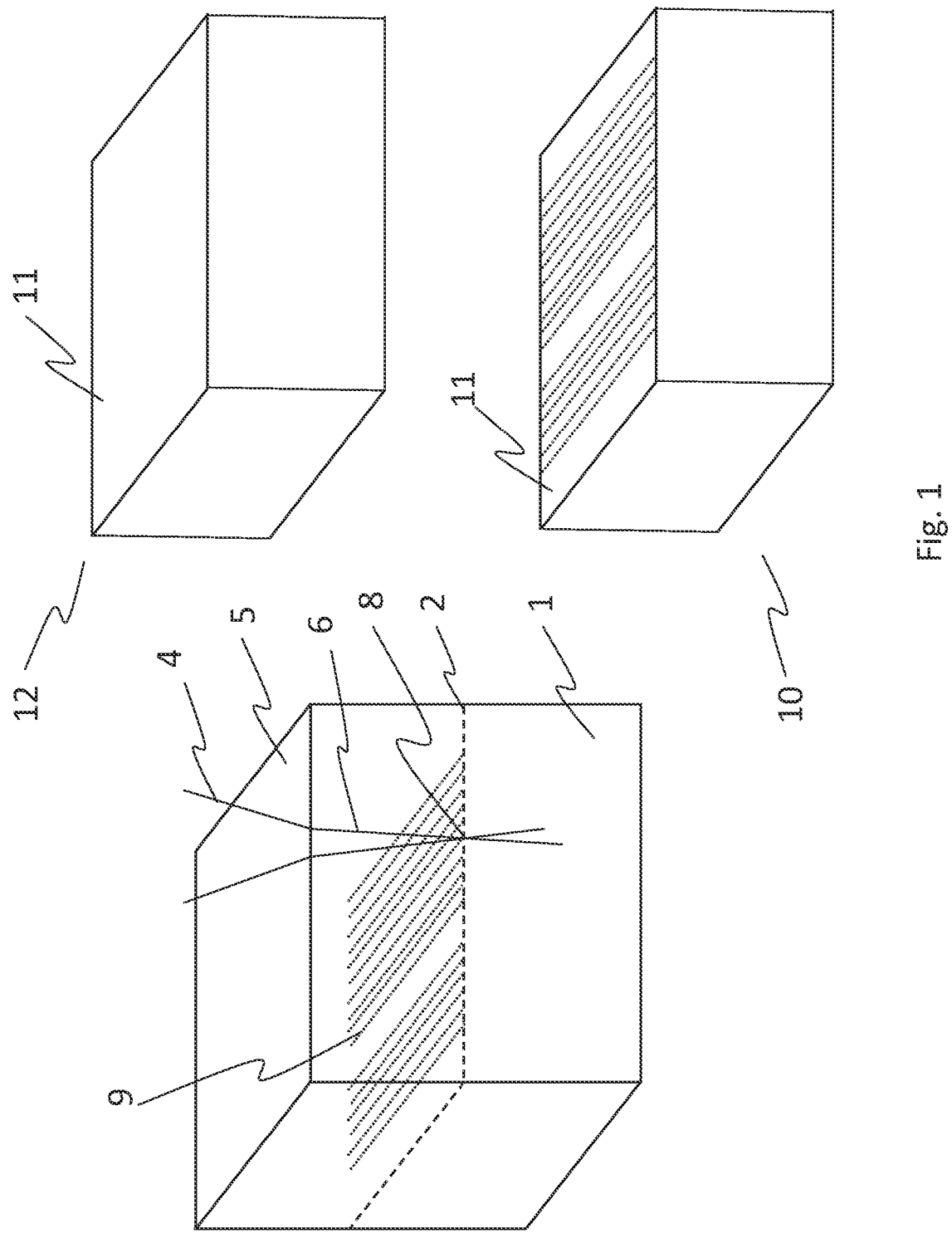
FIG. 1 shows a solid during the treatment according to the invention and the two parts of the solid after they have been separated from one another.
Figure 5A:
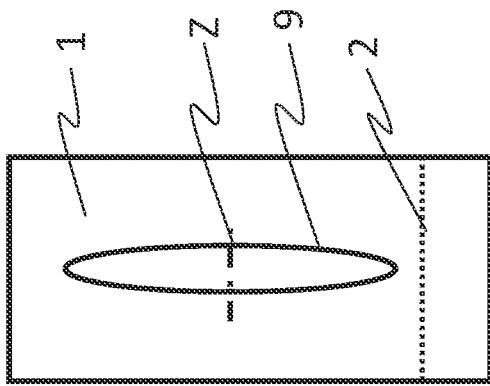
FIG. 5a-5f shows a schematic view of modifications and the detachment region.

FIGS. 5a to 5f show various diagrams of the modification-crack generation relationship. FIG. 5a shows for example a modification 9 shaped, for example, according to the shape of a laser waist. However it is pointed out that the shape of the modification 9 is only shown schematically. Furthermore, shapes deviating from the shape shown are also feasible. A modification 9 can thus preferably have a shape which lies in the design space between a spherical shape, in particular a circle, and a polygon, in particular a square, in a particular a rectangle such as, for example a square. Furthermore, FIG. 5a shows that the detachment region 2 does not extend through the centre Z of the modification 9. Preferably the detachment region 2 is spaced apart from the centre of the modification by 1/20, or 1/10 or 1/5 or 1/4 or 1/3 or half the maximum length of the modification 9.

Figure 5D:
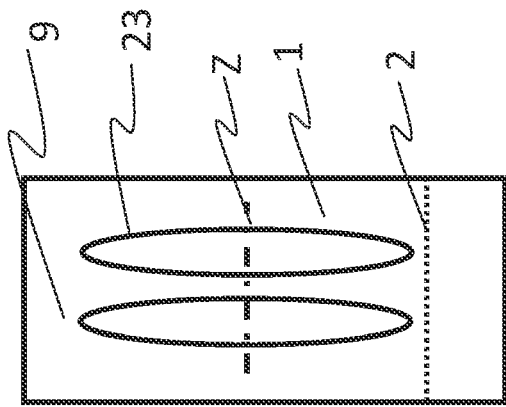
Figure 5B:
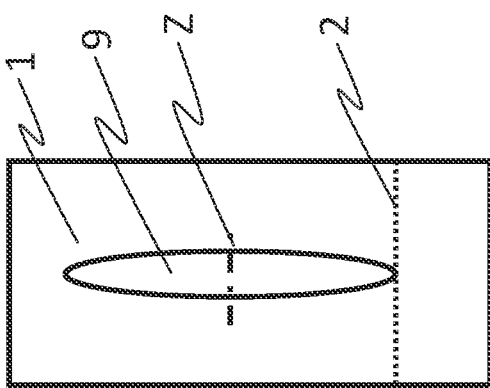

FIG. 5b shows, for example, a variant according to which the detachment region 2 runs past the modification 9 at the outer edge or in the area of the outer edge of the modification 9 and the modification therefore particularly preferably only passes on the outside but does not run through the modification.

Figure 5E:
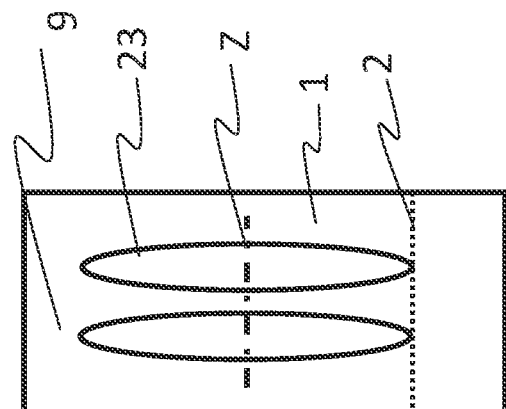
Figure 5C:
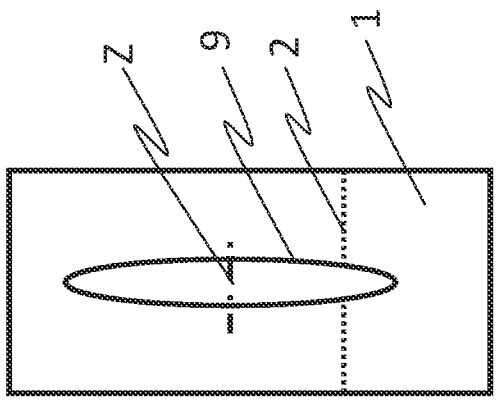

FIG. 5c shows another variant according to which the detachment region 2 is preferably located at a distance from the modification 9 of at least 0.01 μm or at least 0.1 μm or at least 1 μm or at least 5 μm or at least 10 μm.

Figure 5F:
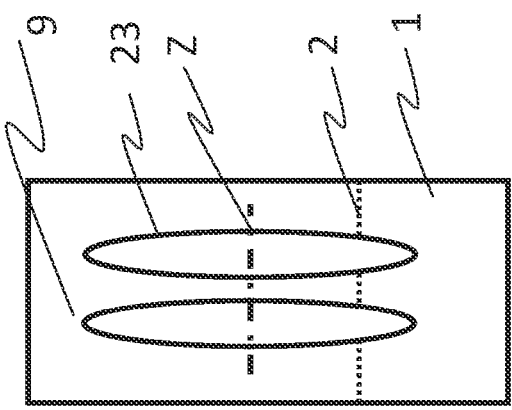

FIGS. 5d to 5f are constructed similarly to FIGS. 5a to 5c. However, FIGS. 5d to 5e show a variant according to which the effect achieved by the modification 9, namely the local separation of the crystal lattice of the solid 1 only takes place as a result of the interaction of several modifications 9, in particular of at least 2, 5, 10, 20, 50 or at least 100 modifications.

FIGS. 6a to 6d show various arrangements of modifications 9 and the detachment regions 2 formed as a result of the modifications 9. As required, the parameters required to produce the modification can therefore be adjusted in such a manner that the detachment region 2 runs through the modifications 9 (cf. FIGS. 6a and 6b) or that the detachment region is at a distance from the modifications 9 (cf. FIGS. 6c-6d).

FIGS. 7a-7d show further variants according to which a detachment region 2 is formed in a solid 1 as a result of the creation of modifications 9. According to FIGS. 7a and 7b, the centres of the modifications 9 and 23 are provided on one side of the detachment region 2. However it is also feasible here that the modifications are produced identically apart from their production site (in particular the distance from the main surface). It is further feasible that additionally or alternatively to the location of the modifications 9, 23, the focus and/or the amount of energy and/or the application time etc. varies. In FIGS. 7c to 7d the centres of the modifications 9 and 23 are each on different sides of the detachment region 2.

It is feasible here that the centres of the modifications 9, 23 are formed at the same distance or at different distances from the detachment region 2. It is further feasible that additionally or alternatively to the location of the modifications 9, 23, the focus and/or the amount of energy and/or the application time etc. varies or is set differently.

FIG. 8 shows an arrangement according to which the modifications 9 are produced locally in different concentrations (A-D) and/or distributions. It is feasible here for example that in order to initiate a main crack connecting the individual cracks, locally different modification concentrations or distributions are provided. Preferably more modifications are produced in the area of a main crack initiation point or a higher modification density is provided.

It is furthermore pointed out that the individual variants shown in FIGS. 5a-5f, 6a-6d, 7a-7d, 8 can preferably be combined with one another.

FIG. 9a shows that in at least two different regions of the solid 1 the number of modifications 9 produced per cm² is different. In a first region a first block 91 of modification lines is produced, wherein the individual modifications 9 per line are produced preferably spaced apart from one another by less than 10 μm, in particular less than 5 μm or less than 3 μm or less than 1 μm or less than 0.5 μm. The individual lines of the first modification block 91 are preferably produced spaced apart from one another by less than 20 μm, in particular less than 15 μm or less than 10 μm or less than 5 μm or less than 1 μm. Due to the first block of modifications 91 mechanical stresses are produced in the solid 1.

In a second region a second block 92 of modification lines is produced, wherein the individual modifications 9 per line are produced preferably spaced apart from one another by less than 10 μm, in particular less than 5 μm or less than 3 μm or less than 1 μm or less than 0.5 μm. The individual lines of the second block 92 are produced spaced apart from one another preferably by less than 20 μm, in particular less than 15 μm or less than 10 μm or less than 5 μm or less than 1 μm. Due to the second block of modifications 92 mechanical stresses are produced in the solid 1.

The first region and the second region are spaced apart from one another by a third region, wherein in the third region none or substantially no modifications are produced by means of laser beams and the first region is spaced apart from the second region by more than 20 μm, in particular more than 50 μm or more than 100 μm or more than 150 μm or more than 200 μm.

The modifications 9 are preferably introduced into the solid 1 here via a surface 5 of the subsequent solid layer 12. The distance between the surface 5 via which the laser beams are introduced to the modifications 9 is preferably less than the distance of the modifications 9 to a further surface 7 of the solid 1 located at a distance from the surface 5 and preferably aligned parallel.

It can be seen that according to this diagram that the detachment region 2 lies on one side of all the modifications 9, in particular below and above in the longitudinal direction of the solid and preferably at a distance from the modifications 9.

FIG. 9b shows a similar basic structure. According to FIG. 9b however the detachment region 2 extends through the modifications 9.

FIG. 9c further shows that the detachment region 2 can also run through the centre of the modifications 9.

The course of the detachment region 2 is adjustable here, for example, by means of the number of modifications 9 and/or the sizes of the modifications 9 and/or the spacing of the individual modifications 9 of a block 91, 92.

FIG. 9d shows the residual solid 1 after separation of the solid layer 12 along the detachment region 2 shown in FIG. 9a. Since in this case the modifications 9 are completely removed from the residual solid 1, the residual solid 1 shows no residues of these modifications 9.

FIG. 9e on the other hand shows residues of the modifications 9. These modification residues are obtained if the solid 1 is separated along a detachment region 2 shown in FIG. 9b or 9c. Furthermore, it can be identified that the modification blocks 91, 92 are preferably separated from one another by fields 901, 902, 903 without modifications or with few modifications per cm². The fields without modification 9 or with few modification 9 can here preferably be smaller or larger than the region in which the modification blocks 91, 92 are produced. Preferably at least individual ones, a plurality of or the majority of the regions in which the modification blocks 91, 92 are produced are many time, in particular at least 1.1 times, or 1.5 times or 1.8 times or 2 times or 2.5 times or 3 times or 4 times larger than the regions in which no modifications 9 or few modifications 9 are produced.

FIGS. 10a-10c show another embodiment of the present invention. According to these diagrams, the modification blocks 91, 92 are used to produce local material weakenings or local solid initial cracks or local increases in stress. The reference number 25 here characterizes a first partial detachment region or crack portion in which the local material weakenings or local solid initial cracks or local increases in stress occur and the reference number 27 here characterizes a second partial detachment region or crack portion in which the local material weakenings or local solid initial cracks or local increases in stress also occur. The individual partial detachment regions or crack portions preferably form ends 71, 72 via which the respective partial detachment region or crack portion can be enlarged.

FIGS. 11a to 11c show embodiments according to which the course of the detachment region 2 as a result of the generation of the modification blocks 91, 92, 93 is controlled in such a manner that predetermined patterns or thickness variations are produced or compensated. The course of the detachment region 2 is hereby adjustable, for example by the number of modifications 9 and/or the size of the modifications 9 and/or the spacing of the individual modifications 9 of a block 91, 92, 93.

In FIG. 11a the detachment region 2 is formed by the components specified hereinafter: crack 31 between outer edge and first modification block 91, which is followed by the first crack portion 25 produced directly by the first block 91 of modifications 9, which is followed by crack 32 between the two modification blocks 91 and 92, which is followed by the second crack portion 27 produced directly by the second block of modifications 9, which is followed by the crack 33 between the modification block 92 and the first outer edge of the solid 1. It is apparent as a result that the detachment region 2 can be predefined in such a manner that a crack for separation of the solid layer 12 from the solid 1 can run on different planes in sections.

According to FIG. 11b it is apparent that the detachment region 2 can be selected in such a manner that the crack course includes several geometrical turning points.

FIG. 11c shows another possible embodiment of the detachment region 2 purely as an example.

With regard to FIGS. 11a-11c it should be noted that the formation of wavy profiles can offer advantages for the further treatment of the exposed surfaces, in particular for subsequent grinding and/or polishing steps. As a result of the actually very small height of the modifications 9, the actual waviness produced as a result can only be detected with very high resolution. However, the crack can be controlled very effectively by means of modification blocks such as, e.g. the blocks 91, 92, 93 even in regions in which none or few modifications 9 are produced.

FIGS. 12a-12c show a multiple treatment of a solid 1, in particular an ingot, wherein the solid 1 is in each case thinned by a solid portion 12, in particular a solid layer 12.

FIGS. 12a-12c therefore each show the application of laser radiation from a laser source on the solid 1, wherein the laser beams penetrate into the solid 1 via a surface 5, 502, 504 of the solid layer 12 to be separated. A predefined portion of the solid 1 inside the solid 1 is temperature-controlled in a defined manner by the laser radiation to form a detachment region 2, the temperature produced in the predefined portion of the solid 1 is preferably so high that the material forming the predefined portion undergoes modification 9 in the form of a predetermined material conversion. The number and arrangement of the modifications 9 can be adjusted and is preferably predefined. After separation of the solid portion 12, a renewed application of laser radiation of the laser light source is made to the residual solid 1, wherein the laser radiation temperature-controls a predefined portion of the residual solid 1 inside the residual solid 1 in a defined manner to form a detachment region 2 and the temperature produced in the predefined portion of the solid 1 is again so high that the material forming the predefined portion undergoes a predetermined material conversion. Thus, for example, solid portions 12 of the same, similar or different thickness, in particular solid layers 12, in particular wafers, can be separated from the solid 1. Preferably the solid 1 has such a length that a plurality of, in particular more than 2 or more than 5 or more than 10 or more than 20 or more than 50 or more than 100 or more than 150 or more than 200 solid layers 12 having a thickness of less than 1000 µm, in particular of less than 800 µm or of less than 500 µm or of less than 300 µm or of less than 200 µm or of less than 150 µm or of less than 110 µm or of less than 75 µm or of less than 50 µm can be separated therefrom. Preferably each separation of a solid layer 12 is followed by a machining of the newly exposed surfaces 502, 504 of the residual solid 1.

FIGS. 13a-13f show schematic diagrams of different process situations such as can occur according to the method according to the invention for producing solid layers 12.

Figure 13D:
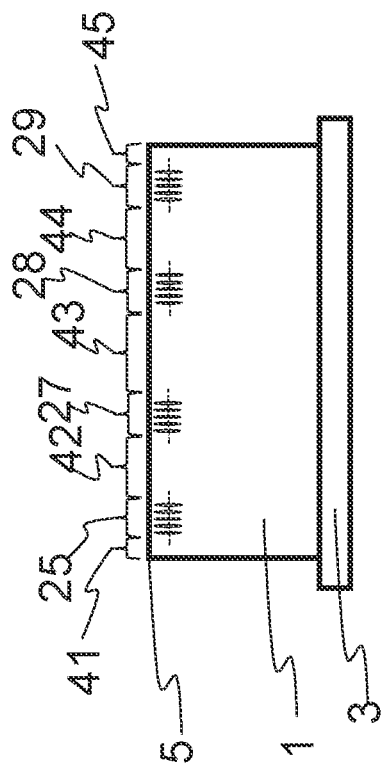
Figure 13A:
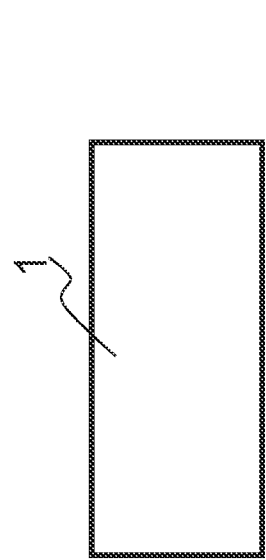

FIG. 13a shows the preparation of a solid 1, in particular an ingot.

Figure 13B:
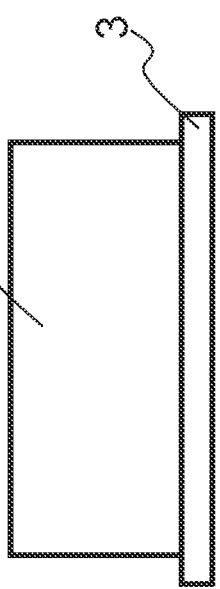

According to FIG. 13b the prepared solid 1 is arranged on a cooling device 3. Preferably the cooling device 3 is a cooling chuck. Particularly preferably the solid 1 is coupled or glued or welded or screwed or clamped on a tool carrier (chuck), wherein the tool carrier preferably comprises a cooling functionality and is thereby preferred to the cooling device 3. The tool carrier preferably consists of an alloy having a composition of 45%-60%, in particular 54% iron, 20%-40%, in particular 29% nickel and 10%-30%, in particular 17% cobalt. The percentage information here relates to the fraction of the total mass. An example for a preferred cooling device 3 is shown in FIG. 11. The solid 1 and the cooling device 3 preferably have the same or a similar thermal expansion. A similar thermal expansion is here preferably understood as that thermal expansion with a temperature increase of 10° C. in a temperature range from −200° C. to 200° C., for which the difference in the thermal expansions of the solid 1 and the cooling device 3 is less than 50%, in particular less than 25% or less than 10% of the thermal expansion of the object showing the greatest expansion (cooling device or ingot). The thermal expansion of the solid 1 is preferably less than 10 ppm/K, in particular less than 8 ppm/K or less than 5 ppm/K such as for example less than ppm/K or substantially 4 ppm/K or precisely 4 ppm/K.

The solid 1 is fixed, in particular glued on the cooling device 3 preferably in the longitudinal direction with its underside 7 which preferably lies opposite the surface 5 in the longitudinal direction. The laser beams are therefore introduced in the direction of the cooling device 3 into the solid 1 to produce the modifications 9 via the surface 5 which is part of the solid layer 12 to be separated.

Figure 13C:
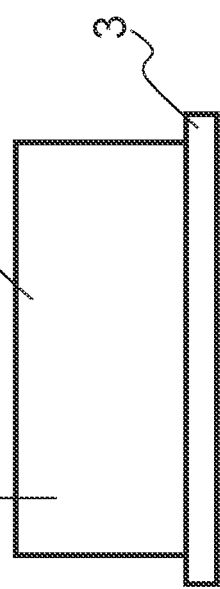

FIG. 13c shows schematically the production of modifications 9 by means of laser beams. The cooling device 3 here has the effect that the energy or heat introduced by the laser beams into the solid 1 is at least partially and preferably predominantly removed from the solid 1.

FIG. 13d shows a schematic sectional view of the solid 1 during the production of the modifications 9. According to this example, four blocks of modifications 9 can be seen which result in the crack portions 25, 27, 28, 29. Adjacent to the blocks with modifications 9, the reference numbers 41, 42, 43, 44 and 45 each identify regions without modifications 9 or regions in which fewer modifications 9 are produced than in the regions in which blocks of modifications 9 are produced. The total crack is in this case preferably formed automatically as a result of the stresses produced due to the creation of the partial cracks.

FIG. 14a shows a view after the laser application shown in FIG. 13c.

FIG. 14b shows a renewed step of introducing modifications 9 into the residual solid 1 which is reduced in its length at least by the already separated solid layer 12.

FIG. 14c shows schematically a further preferred embodiment. The cooling device 3 is here coupled on the one side to the solid 1 and on the other side to a traversing device 30, in particular an X/Y traversing device or a rotary table. The traversing device 30 brings about a movement of the solid 1, with the result that this can be moved in a defined manner with respect to the surroundings and a laser optics, in particular a scanner.

FIG. 14d shows a more detailed schematic view of FIG. 14c. The round arrow inside the traversing device 30 identifies that this is rotatable. Furthermore a coupling layer, in particular an adhesive layer is provided between the solid 1 and the cooling device 3. The coupling layer 30 is here preferably designed in such a manner that it withstands a plurality of treatment cycles, in particular more than 200 or more than 300 or more than 500 treatment cycles at high mechanical or thermal load. Furthermore it can be deduced from this diagram that the laser beam source 401 guides laser beams preferably along a first laser beam conductor 402 to an optical system 40 from where the laser beams reach a scanner by means of a further laser beam conductor 403. Alternatively however it is also feasible here that at least the laser beam source 401 and the scanner 400 are provided.

FIG. 15 shows the cooling device 3. The cooling device 3 preferably has a guide-support structure which is preferably formed by a tool carrier, in particular a chuck. The guide-support structure preferably has a round basic shape. This is advantageous since an imbalance with regard to spinning processes can be avoided more easily. Furthermore, the round basic shape is preferably provided with flattened sections 95-98. These flattened sections are advantageous since they allow or facilitate a coarse alignment and/or cassetting.

Preferably the cooling device 3, in particular the guide-support structure of the cooling device 3, has a good thermal conductivity. Furthermore the cooling device 3 preferably comprises anodized aluminum, thus reducing or preventing abrasion particles. This is advantageous since the clean room compatibility is increased. Furthermore the chuck is preferably compatible to the separation process.

Furthermore, preferably at least two aligning elements 65-68 are provided. Preferably the aligning elements 65-68 are configured as aligning holes or slots or pins. The aligning elements 65-68 preferably form entrainers for the non-positive and/or positive transmission of rotation. Preferably the aligning elements 65-68 have steel or ceramic inserts whereby a high wear resistance is achieved. The aligning elements 65-68 are preferably used to couple the cooling device 3 to the traversing device 30.

Furthermore, register pins can be provided, these can be designed as, for example, downholders whereby, for example, a force and/or tight fit with the guide-support structure can be produced.

A notch, groove or marking 76 is further preferably provided on the cooling device 3. This feature is advantageous since the solid orientation, in particular ingot orientation is apparent as a result. Knowledge about the orientation of the solid, in particular the ingot can be used to adapt the modifications 9 produced by means of the laser beams to the crystallographic orientation.

The reference number 75 identifies purely as an example an optional data carrier element and/or data transmission element and/or data acquisition element. Preferably the element identified by the reference number 75 is implemented as a barcode and/or RFID element and/or SAW sensor. This in particular allows integration into a manufacturing execution system (MES).

Furthermore, cooling channels for guiding a cooling fluid are preferably provided or formed on or in the guide-support structure. The cooling channel or channels 78 can be used for temperature control of the solid, the cooling device 3 and/or a machine holder, in particular the traversing device 30. Cooling fluid, in particular a liquid, can be supplied into the cooling channel 78 via an inlet 77 and removed via an outlet 79. The interface or the coupling layer between solid 1 and cooling device 3 preferably has a high thermal conductivity, in particular corresponding to the thermal conductivity of the solid 1 or the cooling device 3. The cooling device 3 can be additionally or alternatively cooling via the air interface. At high rotational speeds or traversing speeds of the traversing device 30, the air layer formed around the cooling device 3 is very thin so that heat can be removed very efficiently.

Furthermore, an active thermostatic control is preferably integrated in the MES. Additionally or alternatively a process monitoring is carried out for different substrate sizes and thicknesses.

Preferably the fluid channels are sealed in the case of fixed mounting by means of pressing and in the case of rotation by means of, for example, a central annular seal.

The reference number 69 identifies an optional sensor device which is preferably designed as a temperature sensor. Preferably the sensor device is an SAW temperature sensor.

FIG. 16 shows the optical system 40, 608 preferably used to produce the modifications 9. The method according to the invention thus preferably also comprises the step of providing an optical system 40, 608, wherein the optical system 608 preferably comprises at least two deflecting elements 610, 612 for deflecting light beam fractions 616, 618. The light beams 616, 618 are preferably produced and emitted by the laser beam source 401. Furthermore, the method according to the invention preferably comprises the step of deflecting at least two different light beam fractions 616, 618 of the emitted light beam 606 by means of the deflecting elements 610, 612, 613, wherein the light beam fractions 616, 618 are deflected in such a manner that they penetrate into the solid 1 and wherein the different deflecting light beam fractions 616, 618 meet at a focus 620 inside the solid 1 and the physical modification 9, in particular in the form of a lattice defect, is produced by the light beam fractions 616, 618 meeting at the focus 620 or the step of producing and emitting at least two light beams 606 by the light beam source or radiation source arrangement 401. The method according to the invention further preferably comprises the step of deflecting the light beams 606 by means of the deflecting elements 610, 612, 613 wherein the light beams 606 are deflected in such a manner that they penetrate into the solid 1 and wherein the different deflected light beams 606 meet at a focus 620 inside the solid 1 and the physical modification 9, in particular in the form of a lattice defect, is produced by the light beams 6 meeting at the focus 620.

In addition, it is feasible that at least two different light beam fractions 616, 618 of at least one emitted light beam 606, in particular the light beam fractions of several emitted light beams, or the plurality of emitted light beams 606 are deflected by means of the deflecting elements 610, 612, 613, wherein the light beam fractions 616, 618 or the light beams 606 are deflected in such a manner that they penetrate into the solid 1 and wherein the different deflected light beam fractions 616, 618 or the different deflected light beams 606 meet at a focus 620 inside the solid 1 and the physical modification 9, in particular in the form of a lattice defect, is produced by the light beam fractions 616, 618 or light beams 6 meeting at the focus 620.

Furthermore, according to the method according to the invention when several light beams 606 are produced simultaneously, at least two light beams 606 and preferably all the light beams 606 can be split into different light beam fractions 616, 618 which in particular cover different paths and penetrate into the solid at surface portions 622, 624 of the solid 1 located at a distance from one another, wherein the light beam fractions 616, 186 of a respective light beam are deflected by means of different deflecting elements 610, 612, 613.

The optical system 608 preferably comprises at least one light beam splitting means 633, in particular a half-mirror or beam splitter and at least one light beam 606 is split by means of the at least one light beam splitting means 633 into at least two light beam fractions 616, 618. Preferably a light beam 606 is split by means of a light beam splitting means 633, in particular a half-mirror into at least two light beam fractions 616, 618, wherein one light beam fraction 616 is deflected by means of at least two deflecting elements 610, 612, 613, in particular mirrors, in such a manner that it meets the other light beam fraction 618 inside the solid 1 to form a focus 620 for producing the physical modification 9. Particularly preferably a plurality of physical modifications 9 are produced, wherein the physical modifications 9 preferably form or describe a plane and/or a contour and/or a silhouette and/or the external shape of a body.

The at least one light beam 606 emitted by the laser beam source 401 preferably consists of coherent light and the light waves of the light beam fractions 616, 618 meeting at the focus 620 preferably have the same phase or the same frequency.

Particularly preferably at least one light beam fraction 616, 618 or at least one light beam 606 is deflected and focussed by a deflecting element 610, 612, 613 configured as a parabolic mirror.

Furthermore, prior to the deflection and focussing, the at least one light beam fraction 616, 618 or the at least one light beam 606 preferably passes through a deflecting element 610, 612, 613, in particular the parabolic mirror, a beam shaping device, in particular a 1D telescope to change the focal shape.

The laser beam source 41 produces preferably at least or precisely two light beams wherein the light beams 606 are generated with different colours depending on the band gap of the material of the solid 1 in such a manner that the modification 9 is produced by a two-photon process.

Preferably a first laser field is formed by a first light beam 606, wherein the first light beam 606 comprises photons having a first energy and preferably a second laser field is formed by a second light beam 606, wherein the second laser beam 606 comprises photons having a second energy, wherein the first laser field is weaker than the second laser field and the first energy is higher than the second energy.

FIG. 17 shows the production of modifications by means of two laser beams or two laser beam fractions in a schematic view. The modifications 9 here preferably have a vertical extension of less than 50 µm and preferably of less than 30 µm and particularly preferably of less than 20 µm.

The focus 620 is preferably located at a distance of less than 1000 µm and preferably less than 500 µm and particularly preferably less than 200 µm from a penetration surface 626 of the solid 1, wherein at least individual light beam fractions 616, 618 penetrate into the solid 1 via the penetration surface 626 to produce the physical modification 9.

The focus 620 is preferably produced in a superposed fraction of at least two intersecting light beam waists 630, 632, wherein the light beam waists 630, 632 are produced by the light beam fractions 616, 618 or light beams 606.

Thus, a method for producing a detachment region in a solid, in particular for splitting the solid along the detachment region is described, wherein the solid portion to be detached is thinner than the solid reduced by the solid portion, at least comprising the steps: modifying the crystal lattice of the solid by means of a modifying agent, in particular by means of at least one laser, in particular a pico- or femtosecond laser, wherein the modifications, in particular the laser beams penetrate into the solid via a surface of the solid portion to be detached, wherein a plurality of modifications are produced in the crystal lattice, wherein as a result of the modifications, the crystal lattice cracks in the regions surrounding the modifications, at least in respectively one portion.

Furthermore, a method for producing a detachment region (2) in a solid (1), in particular for splitting the solid (1) along the detachment region (2) is described, at least comprising the steps: modifying the crystal lattice of the solid (1) by means of an application by a modifying agent, in particular by means of at least one laser, in particular a pico- or femtosecond laser, wherein a plurality of modifications (9) are produced in the crystal lattice, wherein as a result of the modifications (9) the crystal lattice cracks in the regions surrounding the modifications (9) at least in respectively one portion.

REFERENCE LIST

1 Solid
2 Detachment region
4 Laser beam
5 Polished surface
6 Laser beam in solid
8 Focus
9 Modification
10 First solid portion
12 Second solid portion
13 Crack
14 Location of start of treatment
15 Centre of modifications
16 Underside of solid
17 Reference length
18 Main surface
19 Lateral surface
20 Linear spacing between linearly produced crystal lattice modifications
22 Linear spacing between linearly produced crystal lattice modifications
23 Further modification
25 First crack portion
27 Second crack portion
28 Third crack portion
29 Fourth crack portion
30 Rotary table
31 Crack between outer edge and first modification block
32 Crack between two modification blocks
33 Crack between modification block and further modification block or outer edge
34 Crack between modification block and outer edge
40 Optical system
41 First region without modification block
42 Second region without modification block
43 Third region without modification block
44 Fourth region without modification block
45 Fifth region without modification block
51 Unchanged material
52 Changed material
53 Raman spectrum
54 Intensity in %
56 Wavelength in $cm^{-1}$
61 Graph for unchanged material fraction
62 Graph for changed material fraction
65 First aligning element
66 Second aligning element
67 Third aligning element
68 Fourth aligning element
69 Sensor means
75 Data carrier element and/or data transmission element
76 Groove
77 Fluid inlet
78 Fluid line
79 Fluid outlet
80 Guide-support structure
71 First end of crack portion
72 Second end of crack portion
91 First block of modifications
92 Second block of modifications
112 Second solid layer
113 Third solid layer
300 Coupling layer
630 Light beam waist
632 Light beam waist
400 Scanner
401 Light beam source
402 Light beam conductor
403 Further light beam conductor
501 Exposed surface of first solid layer
502 Laser penetration surface of second solid layer
503 Exposed surface of second solid layer
504 Laser penetration surface of third solid layer
505 Exposed surface of third solid layer
606 Light beam
608 Optical system
610 First deflecting element
612 Second deflecting element
613 Third deflecting element
616 First laser beam fraction
618 Second laser beam fraction
620 Focus 622 First surface portion
624 Second surface portion
630 Laser beam waist
632 Laser beam waist
901 First field without modification
902 Second field without modification
903 Third field without modification
A Example of a first defect arrangement
B Example of a second defect arrangement
C Example of a third defect arrangement
D Example of a fourth defect arrangement
Z Centre

The invention claimed is:

1. A method for producing a detachment region in a solid body, the method comprising:
   providing the solid body having a crystal lattice and that is at least partially transparent to a laser beam emitted by a laser; and
   modifying the crystal lattice of the solid body by the laser beam, wherein the laser beam penetrates through a main surface of a detachable solid portion of the solid body,
   wherein a plurality of modifications are produced in the crystal lattice, wherein the plurality of modifications are formed in a plane parallel to the main surface and at a distance from one another,
   wherein as a result of the plurality of modifications, the crystal lattice cracks sub- critically in regions surrounding the modifications,
   wherein the subcritical cracks are arranged in a plane parallel to the main surface, a plurality of the subcritical cracks forming the detachment region in the solid body along which the solid body is separated into at least two components,
   wherein the plurality of the subcritical cracks pass at least in some sections through a majority of the plurality of modifications.

2. The method of claim 1, wherein the laser has a pulse spacing between 0.01 μm and 10 μm and a pulse repetition frequency between 16 kHz and 1024 kHz.

3. The method of claim 1, wherein the plurality of the subcritical cracks combine to form a main crack through which the solid body is at least partially split.

4. The method of claim 1, wherein:
   the plurality of modifications are produced in a first section of the solid body such that a main crack is formed extending through a plurality of the sub-critical cracks;
   after the formation of the main crack, further modifications are produced in at least one further section of the solid; and
   the main crack is further guided through cracks in an area of the further modifications into the at least one further section of the solid.

5. The method of claim 1, wherein the detachment region has more than one plane parallel to the main surface.

6. The method of claim 1, wherein a centre of a first number of the plurality of modifications are on one side of the detachment region and a centre of a second number of the plurality of modifications are on an opposite side of the detachment region.

7. A method for producing a detachment region in a solid body, the method comprising:
   providing the solid body having a crystal lattice and that is at least partially transparent to a laser beam emitted by a laser; and
   modifying the crystal lattice of the solid body by the laser beam, wherein the laser beam penetrates through a main surface of a detachable solid portion of the solid body,
   wherein a plurality of modifications are produced in the crystal lattice, wherein the plurality of modifications are formed in a plane parallel to the main surface and at a distance from one another,
   wherein as a result of the plurality of modifications, the crystal lattice cracks sub-critically in regions surrounding the modifications, a plurality of the subcritical cracks forming the detachment region in the solid body along which the solid body is separated into at least two components,
   wherein the subcritical cracks are arranged in a plane parallel to the main surface,
   wherein a first number of the plurality of modifications are produced with a centre of the first number of modifications on one side of the detachment region and a second number of the plurality of modifications are produced with a centre of the second number of modifications on an opposite side of the detachment region.

8. A method for producing a detachment region in a solid body, the method comprising:
   providing the solid body having a crystal lattice and that is at least partially transparent to a laser beam emitted by a laser; and
   modifying the crystal lattice of the solid body by the laser beam, wherein the laser beam penetrates through a main surface of a detachable solid portion of the solid body,
   wherein a plurality of modifications are produced in the crystal lattice, wherein the plurality of modifications are formed in a plane parallel to the main surface and at a distance from one another,
   wherein as a result of the plurality of modifications, the crystal lattice cracks sub-critically in regions surrounding the modifications, a plurality of the subcritical cracks forming the detachment region in the solid body along which the solid body is separated into at least two components,
   wherein the subcritical cracks are arranged in a plane parallel to the main surface,
   wherein:
   in at least two different regions of the solid body, tho a number of the plurality of modifications produced per cm2 is different;
   a first block of modification lines is produced in a first region, each modification line of the first block of modification lines being produced spaced apart from another modification line of the first block of modification lines by less than 20 μm;
   a first partial detachment region is formed by the first block of modification lines;
   a second block of modification lines is produced in a second region, each modification line of the second block of modification lines being produced spaced apart from another modification line of the second block of modification lines by less than 20 μm;
   a second partial detachment region is formed by the second block of modification lines;
   the first partial detachment region and the second partial detachment region are spaced apart from one another by a third region;
   in the third region, none or substantially none of the plurality of no modifications or fewer of the plurality of modifications per cm2 compared with the first partial detachment or second partial detachment region are produced by the laser beam; and the first partial detachment region is spaced apart from the second partial detachment region by more than 20 μm.

9. The method of claim 8, wherein the first block of modification lines are produced by the laser having a pulse spacing between 0.01 μm and 10 μm and a pulse repetition frequency between 16 kHz and 20 MHz.

10. The method of claim 8, wherein the first partial detachment region and the second partial detachment region are in different planes parallel to the main surface.

11. The method of claim 8, wherein a centre of the plurality of modifications of the first partial detachment region are on one side of the first partial detachment region, and a centre of the plurality of modifications of the second partial detachment region are on an opposite side of the second partial detachment region.

* * * * *

UNITED STATES PATENT AND TRADEMARK OFFICE
CERTIFICATE OF CORRECTION

| | | |
|---|---|---|
| PATENT NO. | : 11,527,441 B2 | Page 1 of 1 |
| APPLICATION NO. | : 17/174432 | |
| DATED | : December 13, 2022 | |
| INVENTOR(S) | : C. Beyer et al. | |

It is certified that error appears in the above-identified patent and that said Letters Patent is hereby corrected as shown below:

On the Title Page

Item (57) abstract (Line 8), please change "modification" to -- modifications --.

In the Claims

Column 18, Line 45 (Claim 8, Line 23), please change "tho a" to -- a --.

Column 18, Line 66 (Claim 8, Line 44), please change "of no" to -- of --.

Signed and Sealed this
Twenty-ninth Day of August, 2023

Katherine Kelly Vidal
*Director of the United States Patent and Trademark Office*